United States Patent
Lee et al.

(10) Patent No.: US 6,381,670 B1
(45) Date of Patent: *Apr. 30, 2002

(54) FLASH MEMORY ARRAY HAVING MAXIMUM AND MINIMUM THRESHOLD VOLTAGE DETECTION FOR ELIMINATING OVER-ERASURE PROBLEM AND ENHANCING WRITE OPERATION

(75) Inventors: Peter Wung Lee, Saratoga, CA (US); Hsing-Ya Tsao, Taipei (TW); Fu-Chang Hsu, Taipei (TW); Wen-Tan Fan, Taipei (TW)

(73) Assignee: Aplus Flash Technology, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/823,571

(22) Filed: Mar. 25, 1997

Related U.S. Application Data

(63) Continuation-in-part of application No. 08/779,765, filed on Jan. 7, 1997, now abandoned.

(51) Int. Cl.⁷ ............................................. G06F 12/16
(52) U.S. Cl. ..................................... 711/103; 365/104
(58) Field of Search ........................ 365/94, 103, 104; 711/103, 102

(56) References Cited

U.S. PATENT DOCUMENTS

| | | | | |
|---|---|---|---|---|
| 5,386,132 A | * | 1/1995 | Wong | 257/316 |
| 5,485,423 A | * | 1/1996 | Tang et al. | 365/185 |
| 5,627,789 A | * | 5/1997 | Kalb, Jr. | 365/205 |
| 5,734,919 A | * | 3/1998 | Walsh et al. | 395/800 |
| 5,774,397 A | * | 6/1998 | Endoh et al. | 365/185.19 |

* cited by examiner

*Primary Examiner*—Do Hyun Yoo
*Assistant Examiner*—Christopher S. Chow
(74) *Attorney, Agent, or Firm*—George O. Saile; Stephen B. Ackerman; Billy J. Knowles

(57) ABSTRACT

A flash memory having over-erased cells eliminated and comprising adjustable erase and program conditions. The maximum and minimum threshold voltages of the cells are measured during the whole erase and program operations. The over-erased cells are shut down by applying a word line voltage lower than the minimum threshold voltage measured previously. Pre-program and repair operations for the over-erased cell are eliminated. Low read voltage is achieved. The erase and program conditions for the gate, source, drain voltage, width of a pulse, and number of pulses are adjustable in accordance with the threshold voltage to optimize the performance. A lookup table stores the relevant gate, source, drain voltage, width of a pulse, and number of pulses with respect to the threshold voltage for the adjustable conditions. The benefits achieved by the operation of the flash memory include high efficiency, long endurance, narrow threshold voltage distribution, low power consumption, and low process-sensitivity.

43 Claims, 23 Drawing Sheets

FLASH MEMORY ARRAY HAVING MAXIMUM AND MINIMUM THRESHOLD VOLTAGE DETECTION FOR ELIMINATING OVER-ERASURE PROBLEM AND ENHANCING WRITE OPERATION

This is a continuation-in-part of U.S. Ser. No. 08/779,765, filed Jan. 7, 1997, now abandoned.

FIELD OF THE INVENTION

The present invention relates to a non-volatile memory, more particularly to a flash memory which eliminates pre-programming and repairing by applying a world line (WL) voltage lower than the minimum threshold voltage to shut off all cells including over-erased cells, and provides erasing and programming operations with adjustable bias conditions in accordance with the threshold voltage of the cell to improve the performance.

BACKGROUND OF THE INVENTION

Flash memories are used for their property of data non-volatility. Two kinds of flash memory are commonly available. One is EPROM type flash and the other is EEPROM type flash. These two types of flash are categorized by their data erase/program mechanism. The data of a memory cell depend on the number of electrons in the floating gate of the cell. The more electrons in the floating gate, the higher the threshold voltage (Vt). The cell's data are altered by applying a strong electric field between the floating gate and the source (or drain) region to transfer the electrons. The process of removing the electrons for reducing the Vt is called erase. The process of accumulating electrons for increasing the Vt is called program.

The EPROM type flash uses Fowler-Nordheim (F-N) tunneling effect to erase cells' threshold voltages (Vts) to a low state, and uses channel-hot-electron (CHE) injection to program cells' Vts to a high state. For EEPROM type flash, F-N tunneling is used in both erasing and programming.

The EPROM type flash requires lower programming voltage and, thus, has higher program efficiency than the EEPROM type flash. It also has more market share at present. However, this type of flash erases a block of cells' Vts to low together, so its performance is constrained by an undesirable issue called over-erasure.

Over-erasure results from the block erase scheme and the inherent difference between the erased speed of each cell. Because a large number of cells are erased together, the cells having fast erase speed may be over-erased below 0 V, which is applied to the unselected WLs in verify, repairing, and read mode, while the cells having slow speed are not successfully erased yet. The over-erased cells will conduct leakage current and cause the malfunction of bit line (BL) sense amplifiers.

To overcome this problem, a conventional erase/program operation includes two additional operations, pre-programming and repairing, before and after the erasing, respectively. FIG. 1 shows the flowchart of a conventional erase/program operation as shown in the prior arts (U.S. Pat. No. 5,359,558) and (U.S. Pat. No. 5,237,535). A number of drawbacks are associated with the conventional erase/program operation. These drawbacks are illustrated as follows.

Firstly, the repairing is performed by applying a low voltage (e.g. 0 V to 0.5 V) to all the world lines (WLs) and a high voltage, such as +5 V to bit line by bit line, to program Vts of all the cells, no matter over-erased or not, back to positive. The experimental result from the prior art (U.S. Pat. No. 5,335,198) showed that, after hundreds of milliseconds to 1 second, the over-erased cell will saturate at approximately 0.6 V. However, this method is difficult for applications with low power supply in that the drain voltage needs to be supplied by an on-chip charge pump. Because the supply current of the charge pump is small, the drain voltage can not be maintained if the number of over-erased cells in a block increases, resulting in failure of the repairing. There are two reasons why the number of the over-erased cells increase. The first one is the shrinkage in the size of cells, which results in process variation increases and thus increases the number of fast cells. The second one is a large block size. The latter problem can be solved by sub-dividing the block into blocks of smaller size for repairing, however, it significantly increases the repairing time.

Secondly, all the cells in the erased block have to be successfully pre-programmed and pre-program verified prior to the erase step to ensure that all the cells have high initial Vt to prevent those cells originally in a erase state from being over-erased. This additional operation drastically increases the erase time, the power consumption, and the stress of the cells that reduces the cells' endurance.

Thirdly, for applications using low voltage power supply, e.g. 3 V, the power supply voltage can not be directly applied and has to be boosted to 5 V in order to read the data. FIG. 2 shows the Vt distribution of flash memories during the erase/program operation of the prior arts. As shown in FIG. 2, Vev is the erase-verify voltage, Vr is the read voltage, Voe is the over-erase voltage, and Vpv is the program-verify voltage. The Vt distribution of the cells as illustrated by B is moved to a distribution as illustrated by C after the pre-program operation. The erase operation changes the Vt distribution from C to A. The repair operation changes the distribution from A to B and the program operation moves the distribution from B to C. The erase-verify voltage Vev, i.e., the upper limit of the erase state, must be high to keep the majority of the erased cell distribution away from being over-erased. Lowering the verify voltage will increase the number of over-erased cells, thus increases the difficulty of repairing.

According to a referenced paper (IEEE Journal of Solid State Circuits, Vol. 27, No. 4, pp. 583, April 1992), the acceptable value of Vev is 3.4 V in the present process. Therefore, for 3 V power supply, the selected WL has to be boosted to approximately 5 V to read data with a WL boost circuit as shown in the prior art (U.S. Pat. No. 5,511,026). The overhead of the boost circuits and power consumption are both greatly increased.

Fourthly, the erase-verification takes a risk of mis-verifying a programmed cell which is a severely over-erased cell or a lightly over-erased cell, as a properly erased cell due to the leakage current.

Fifthly, the repairing is performed on all the erased cells because the over-erased cells can not be distinguished from normally erased cells. Thus the stress of normally erased cells are increased, or moreover, over-repaired to the program state, as reported in U.S. Pat. No. 5,237,535.

Finally, the bias condition for erase/program operations of the prior arts can not provide an optimal performance. With reference to FIGS. 3A and 3B for two bias conditions of erase operation and to FIG. 4 for a bias condition of the CHE program operation as shown in the prior art (U.S. Pat. No. 5,077,691), the bias conditions do not consider the Vt distribution of the cells selected to be erased or programmed.

Cells with different Vt values are erased or programmed by the same bias conditions. Besides, the cells' Vt values are changed during the whole erasing and programming operations. The bias conditions are not provided in accordance with true Vt values of the cells but are predetermined. A detailed explanation will be given in the next paragraph to show that the predetermined condition can not provide optimal erase/program performance during the whole erase/program operations because the performance is degraded when cell's Vt change.

SUMMARY OF THE INVENTION

The present invention is designed to overcome the drawbacks mentioned above. The invention presents a novel approach for erasing and programming a flash memory to completely avoid over-erasure induced problems in the prior arts and enhance the erase/program performance by using a novel adjustable bias condition. All the penalties of the conventional operations, including pre-programming and repairing, are eliminated by this invention. In addition, long endurance cycle times and high program efficiency are achieved. FIG. 5 shows the flowchart of the operation in the invention.

To overcome the over-erasure induced problem, the cells which are defined as being over-erased in the prior arts are shut off by a negative WL voltage, which is lower than the minimum Vt of all the erased cells in the erase block, and are directly programmed to a low Vt defined as data "0" or to a high Vt as data "1" in the regular program procedure. Pre-programming and repairing are eliminated. Besides, the number of WLs for the erase or program operation is selected by a user.

In the present invention, the Vts of the cells can be measured during the whole erase, program, and verify operations so that the optimal conditions for the erase operation to reduce hole trapping and for the program operation to obtain maximum tunneling current are determined in accordance with the Vts of the cells. The power consumption and operation time are significantly reduced and a narrow distribution of Vts as well as longer endurance for the flash memories are also achieved.

DETAILED DESCRIPTION OF THE PREFERRED EMBODIMENTS

U.S. Pat. No. 5,822,252 has disclosed a row decoder to avoid over-erasure induced problems for flash memories. With the row decoder, this invention further implements a novel erase/program operation to achieve high efficiency, low power consumption, low cell stress, tight Vt distribution, low read voltage and fast speed in changing the data of a flash memory. The invention also implements a novel adjustable bias condition in accordance with the Vt of the selected cell to further maximize the performance and endurance in erase/program operations.

Figure 5:
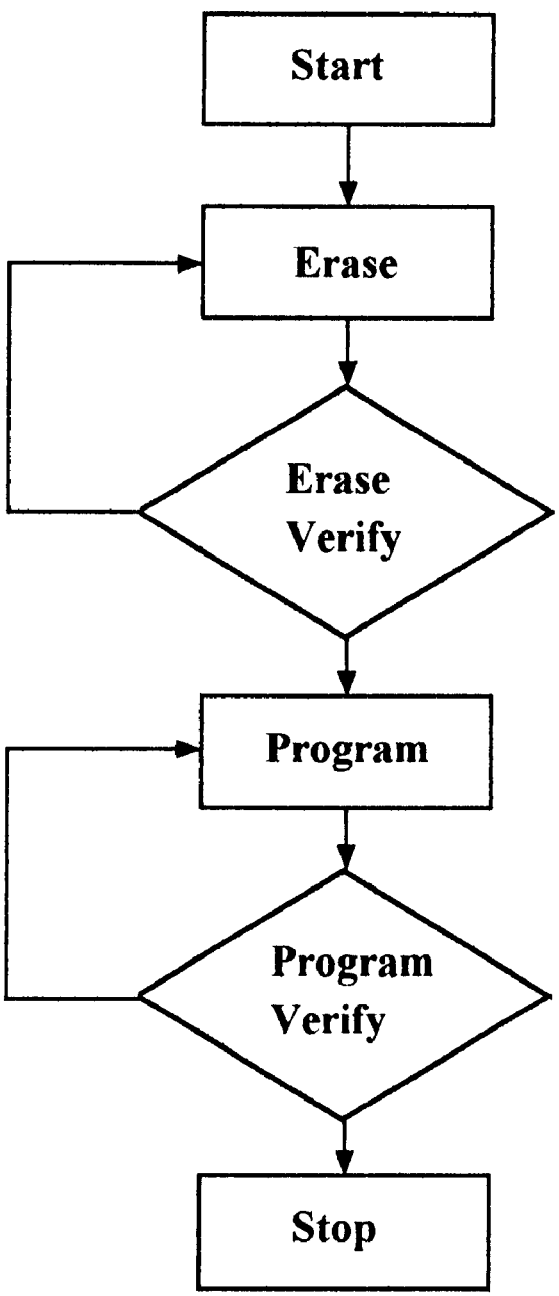
FIG. 5 shows the flowchart of the erase and program operations in the present invention.

With reference to FIG. 5, there are four steps in the erase/program operation including erase, erase verify, program and program verify operations. Pre-program and repair operations are eliminated because the problem of over-erased cells have been overcome by the row decoder. A brief description of the row decoder that avoids over-erasing is given below and please refer to the U.S. Pat. No. 5,822,252 for details.

The row decoder in the U.S. Pat. No. 5,822,252 provides three voltages. The first voltage, a negative voltage lower than the minimum Vt of all the over-erased cells, is applied to the erased word lines (WLs) except the one being verified, read, or programmed. Should there are over-erased cells on these WLs, they will be shut off by the negative voltage. The second voltage, a positive voltage, is applied to the selected WL for verifying, reading, or programming. The third voltage, a voltage lower than the minimum Vt of the normally erased cells such as 0 V, is applied to the unerased WLs. With this novel row decoder, all the unselected cells including the over-erased cells are shut off so that no over-erasure induced issue exists. All the cells in the array can be verified, programmed, and read as normal. This method works well for any number of over-erased cells. Therefore, the limitation of insufficient supply current during an erase-repair operation due to a large number of over-erased cells and the requirement of pre-programming are eliminated. Thus, FIG. 5 shows the flowchart of the novel erase and program operations of the present invention.

The conventional row decoder provides only two voltage levels. If the unselected WLs are provided with a negative voltage, programmed cells on the unselected WLs will breakdown during repairing.

Figure 6A:
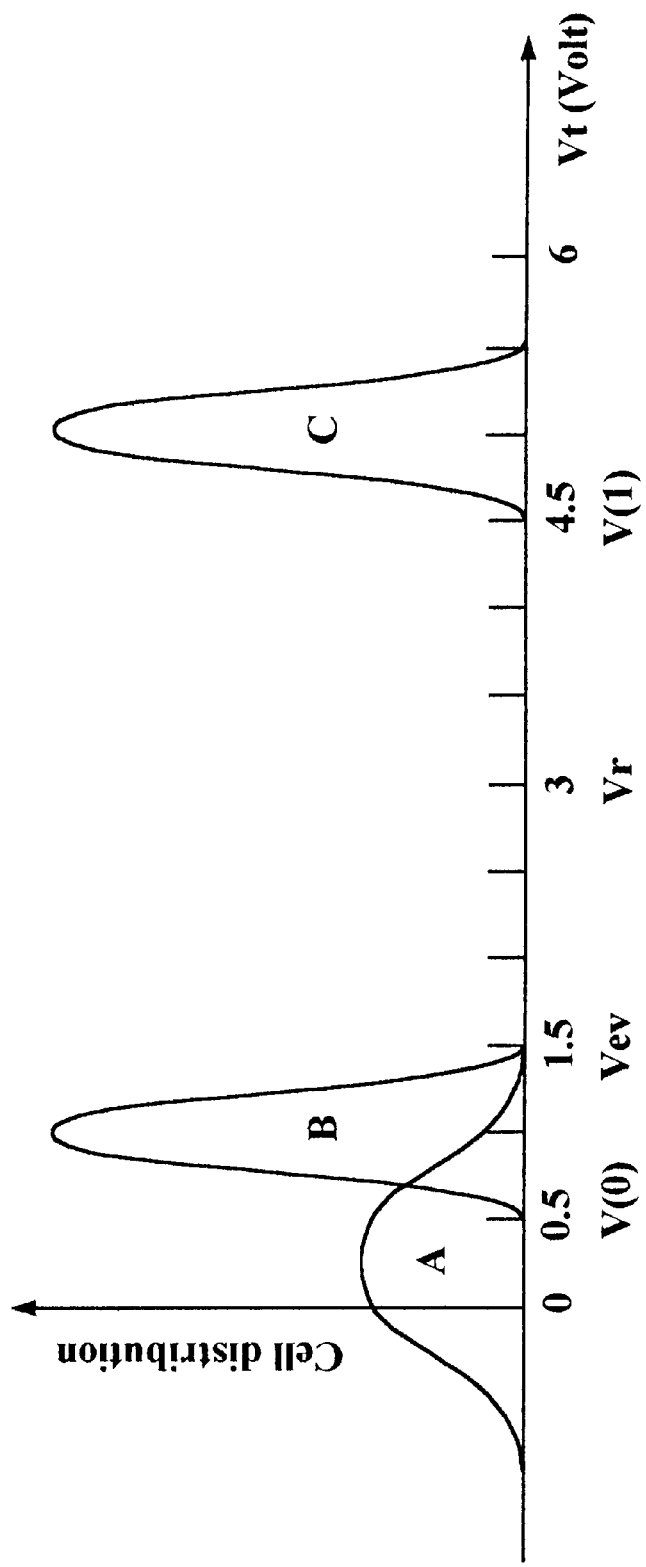
FIG. 6A and FIG. 6B show Vt distributions for the erase and program operations in the present invention.
Figure 6B:
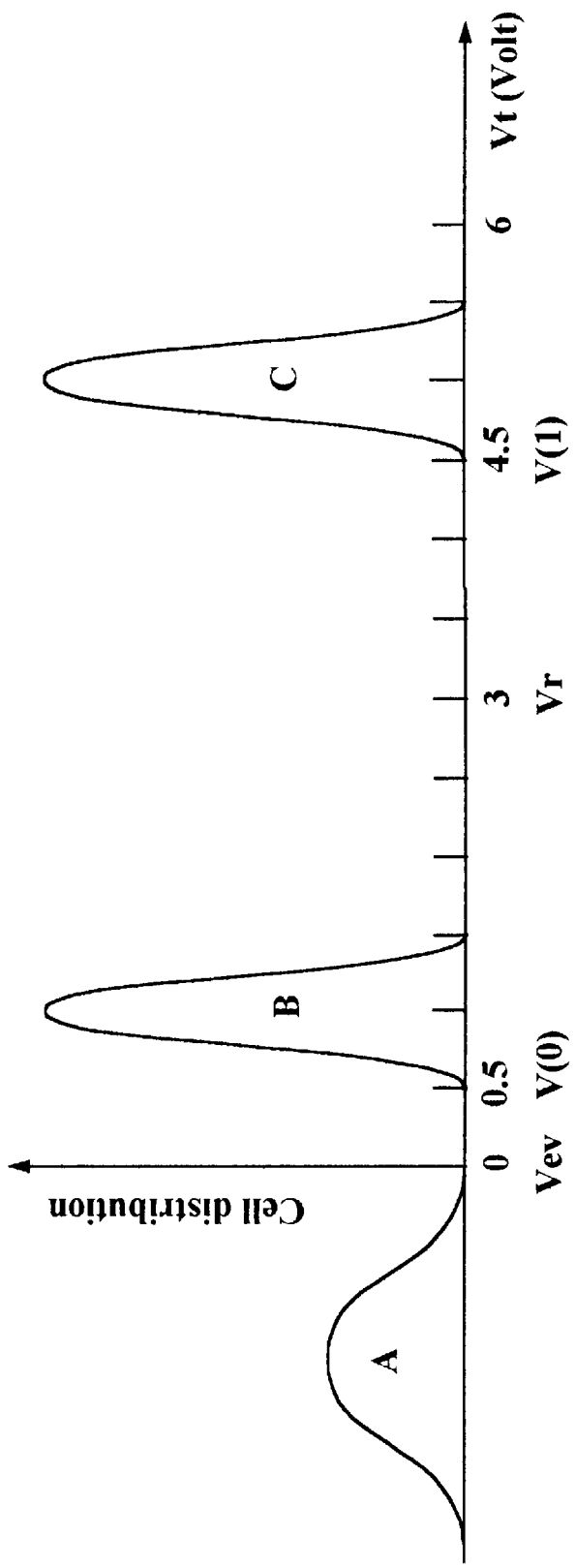

The row decoder also provides a novel highly flexible-size erase scheme which includes multiple-random-selectable page (WL) erasure, multiple-random-selectable block erasure, and chip erasure to provide the most friendly applications and reduce the burden of the control circuits. In addition, each page (WL) which passes erase-verification will stop erasing immediately. Thus, it reduces the number of over-erased cells and cell stress. In contrast, the prior arts provide a fixed size of block erase scheme, such as 64 KB per block, and all the cells in the block have to start and stop being erased together. Therefore, fast erased cells in a block have to accompany the slowly erased cells in an erase operation even if there are only few slow cells. Hence the number of over-erased cells is increased. FIGS. 6A and 6B show the Vt distributions of the erase/program operation for two exemplary embodiments of the invention. In both embodiments, all the selected cells are directly erased from their own initial states without pre-programming, thus the cells in a low state may be over-erased. As shown in FIGS. 6A and 6B, the Vt distributions are changed from B or C to A. After all the cells pass erase-verification, the erase process stops. The over-erased cells will be programmed back to data "0" with normal CHE programming process. Because the over-erased cells are identified and bit-selected CHE programming is utilized, fast programming and more accurate Vt than the repairing of the prior arts can be obtained. The programming of data "1" is performed also with normal CHE programming.

As shown in FIG. 6A, the erase-verify voltage Vev is as low as 1.5 V. Therefore, for applications with low voltage power supply such as 3 V, the power supply voltage can be directly applied as the read voltage Vr. This saves approximately 65% of power consumption in a read operation. V(0) is the program-verify voltage for data "0", which is 0.5 V. V(1) is the program-verify voltage for data "1", which is 4.5 V.

With reference to FIG. 6B, in this embodiment the erase-verify voltage Vev is 0 V to make all the erased cells over-erased and then all of them are programmed back to V(0), i.e., 0.5 V. In this embodiment, the iterative erase/verify step can be replaced with a deep-erase step, which applies a longer erasing pulse, such as 1 second, depending on the device characteristic, to over-erase all the cells in one shut, and then program all the cells back to V(0), which is 0.5 V. Both embodiments provide tight Vt distribution, low read voltage, and fast erase time.

The invention also presents a method for providing novel adjustable bias conditions for erase/program operations. The method of this invention keeps on updating the bias condition in accordance with cells' Vts, so that the optimal performance can be obtained. Two improvements obtained from the method are explained as follows. For erasing, the hole trapping of the higher Vt cells can be reduced so that longer endurance is achieved. For programming, the maximal tunneling current for the slower cells can be obtained so that fast programming and tight Vt distribution are achieved.

Figure 1:
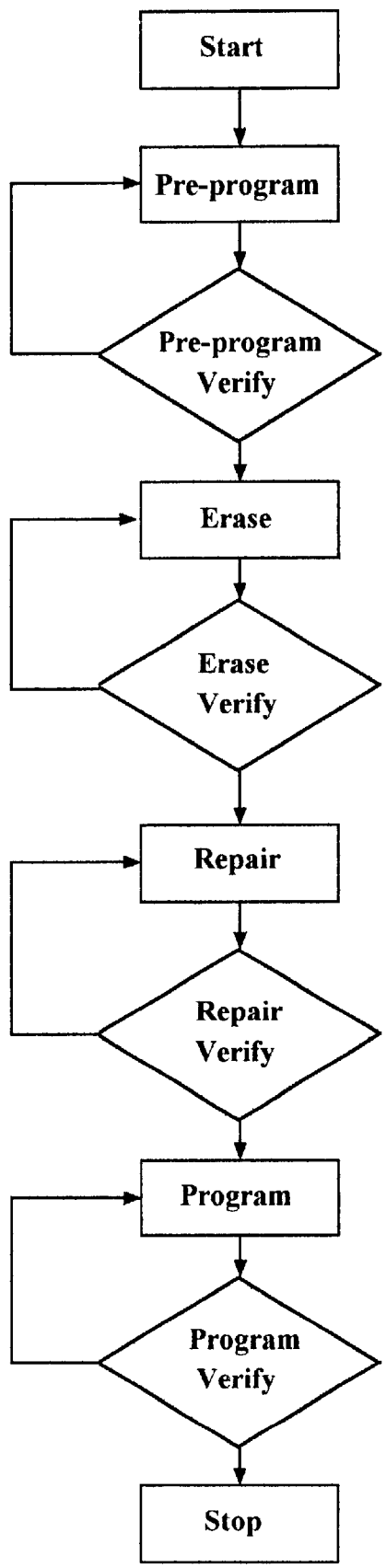
FIG. 1 shows the flowchart of the erase and program operations in the prior arts.
Figure 2:
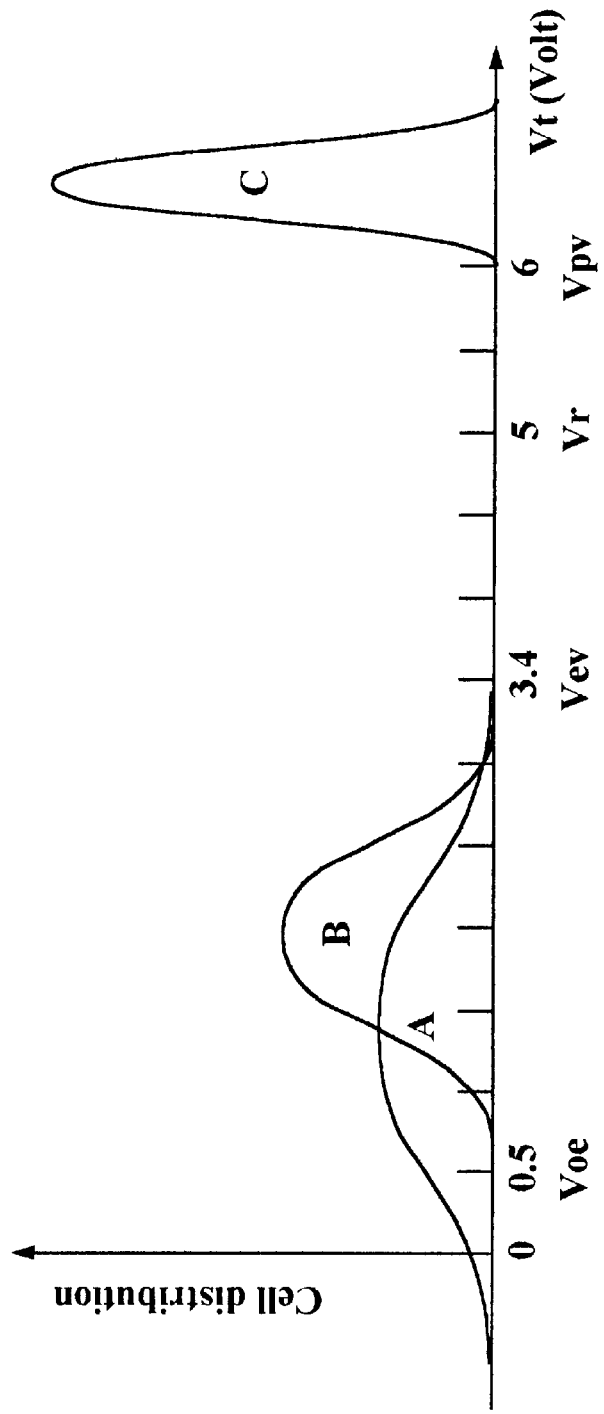
FIG. 2 shows Vt distributions for the pre-program, erase, repair, and program operations in the prior arts.
Figure 3A:
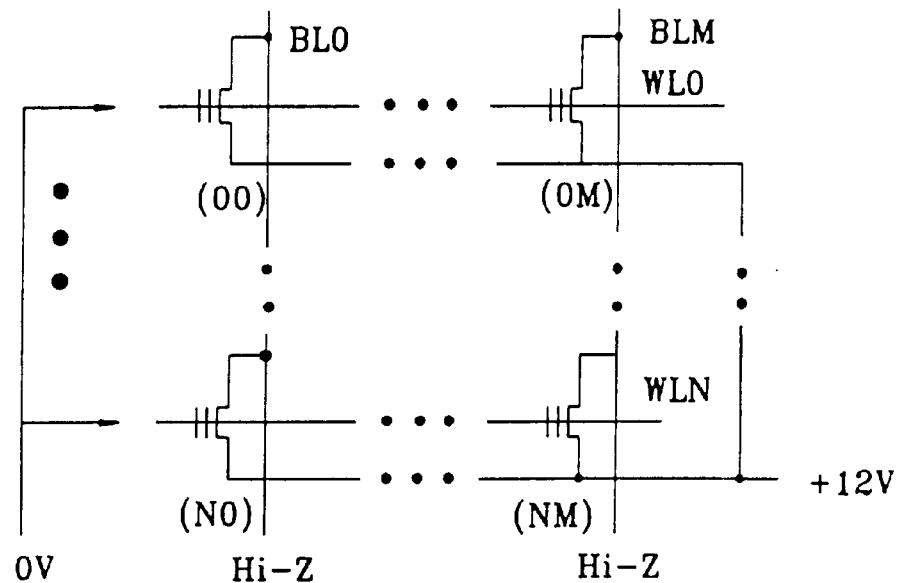
FIGS. 3A and 3B show two predetermined bias conditions for the erase operation in the prior arts.
Figure 3B:
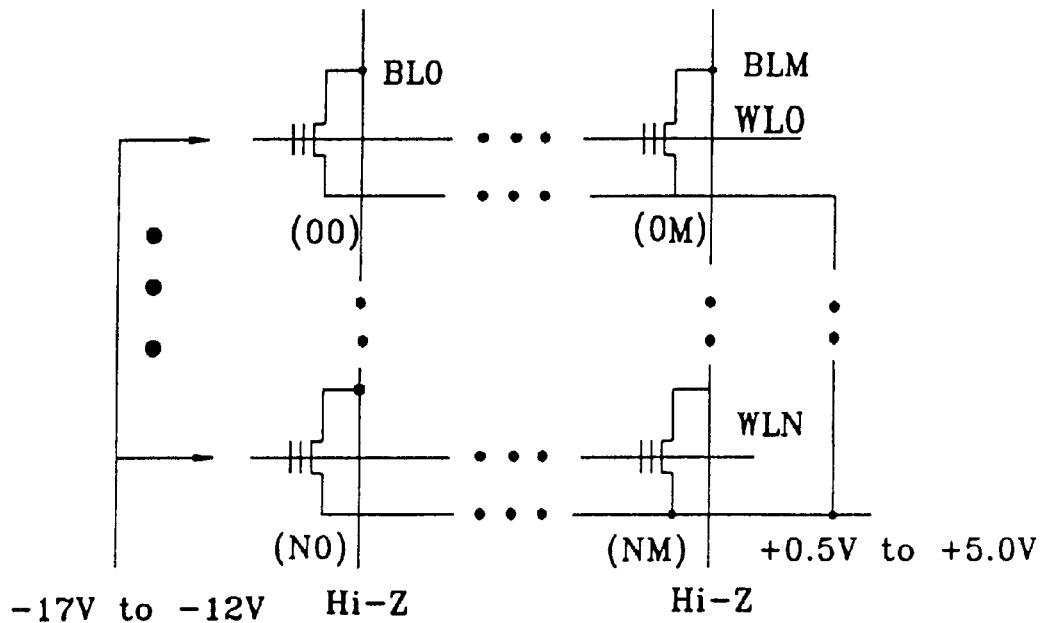
Figure 7:
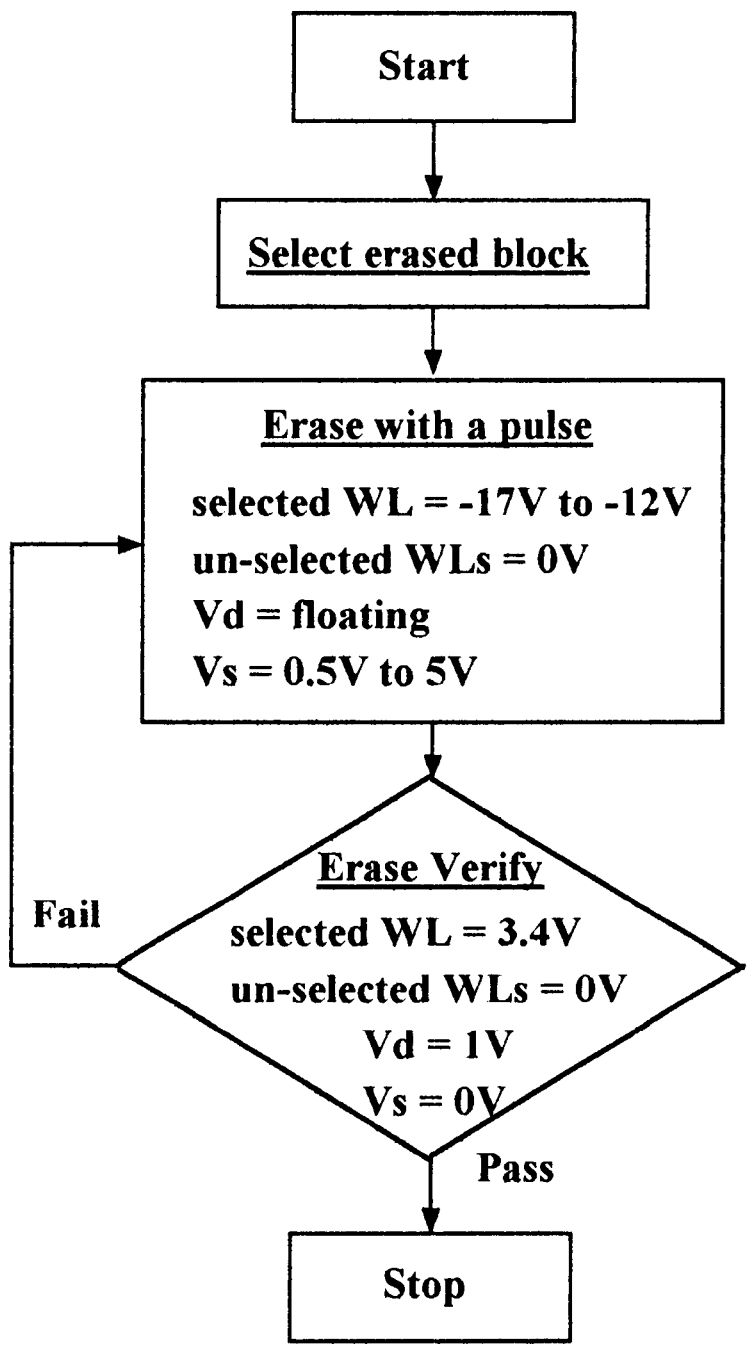
FIG. 7 shows the flowchart of the conventional erase operation with a predetermined bias condition.

With reference to FIG. 7, the flowchart of the conventional erase operation with predetermined bias condition as shown in FIG. 3B is shown. The bias condition can not provide optimal performance as mentioned. For erasing, the most significant factor of the performance is the potential difference, Vsf, between the source and the floating gate. The Vsf is determined by the following equation:

$$Vsf = Vs - Vf$$
$$= Vs - Csf * Vs - Ccf * Vc + Ccf * Vt$$

where Vs is the voltage between the source and the substrate, Vf is the voltage between the floating gate and the substrate, Csf is the capacitive coupling ratio between the source and the floating gate, Ccf is the capacitive coupling ratio between the control gate and the floating gate, Vc is the voltage between the control gate and the substrate, and Vt is the threshold voltage of the floating gate.

It is known that Vsf must be greater than a high voltage approximately 12 V, depending on the device characteristic, to induce high enough electric field (approximately 8 MV/cm) between the source and the floating gate to generate tunneling current. As cell's Vt decreases during the erasing, Vsf is decreased and erasing efficiency is lowered down. The voltages at Vs and Vc are selected in such a way that Vsf must be able to erase cells even if Vt is low. However, such bias condition results in Vsf too high at the beginning of erasing and results in a known hole trapping problem.

Hole trapping mechanism has been studied in a referenced paper (1989 IEDM, 25.6.1). It was shown to have a significant effect in reducing cells' endurance. During erasing, holes in the source depletion region are accelerated by the Vsd (source to drain voltage) induced lateral electric field, and vertically attracted by the Vsf induced electric field. A portion of the holes are injected to and trapped in the tunnel oxide. The trapped holes will increase the erase time. Besides, these holes can be de-trapped due to aging or read disturbance and escape from the oxide. This causes the cells' Vt to shift high and then degrades the data retention.

A prior art (U.S. Pat. No. 5,485,423) proposed a method for avoiding the above problem by decreasing the voltage at the selected WLs stepwise from a starting voltage of −5 V with a decreasing rate of 0.09 V every 10 ms pulse. Nevertheless, because the cells' Vts may not change with the same rate as the predetermined decreasing rate, the method provides some improvement but does not offer the best performance.

The present invention adjusts Vs, Vc or Vd (the drain voltage) according to cells' Vts to ensure that Vsf is always kept at the desired value (can be a range) to achieve less hole trapping during the whole erase process. Three exemplary conditions for the erase operation are described as follows:

1. Vs is raised as the maximum Vt of the erased cells is lowered to reduce the Vsd and Vsf induced electric fields. It is not necessary to pump the source voltage Vs above the power supply voltage in the beginning of the erase operation. A more negative voltage and a less positive voltage can be applied to the erased word line and the source respectively. For example, −8 V is preferably applied to the erased word lines with the source voltage being set at +3 V. It is less desirable to apply −6 V to the word line and +5 V to the source when the maximum Vt is detected initially.
2. Vc is lowered as the maximum Vt of the erased cells is lowered to keep the Vsf induced electric field constant.
3. Vd is applied with a low voltage, e.g. 1.5 V, rather than floating to reduce the Vsd induced electric field.

Figure 8:
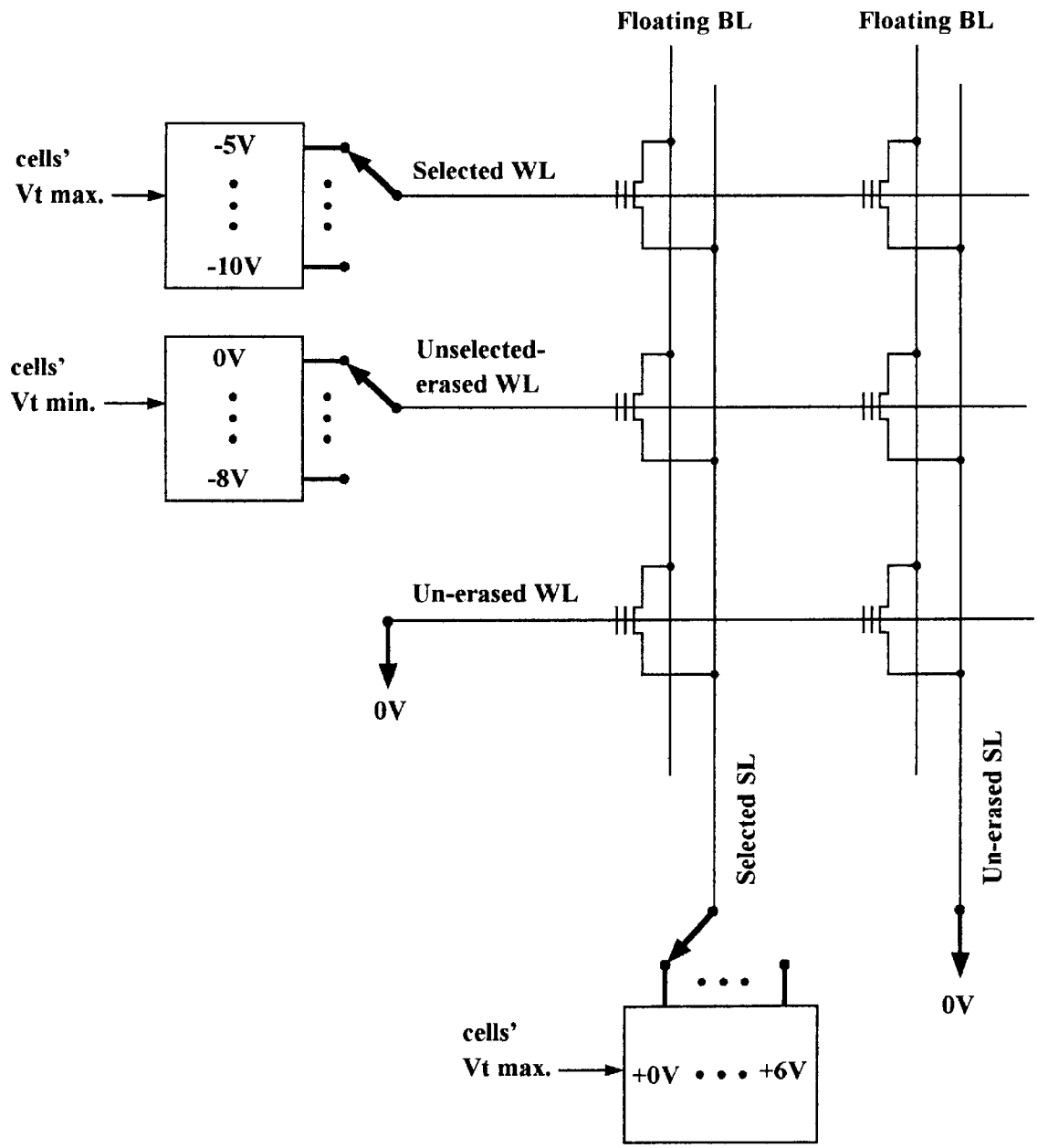
FIG. 8 shows an adjustable bias condition for the erase operation in the present invention.

An additional advantage is also obtained from the adjustable bias condition of this invention. Because Vsf is adjusted according to the maximum Vt of the erased cells which is the Vt of the cell having the slowest erase speed, one bias condition will erase the slow cells faster and the fast cells slower. Therefore, the Vt distribution is tightened. FIG. 8 shows an example of the adjustable bias condition for the erase operation in the invention, where the selected WLs are applied with a voltage between −5 V to −10 V determined from a lookup table according to the maximum Vt of the cells to be erased. The unselected WLs are applied with 0 V. The erased source line (SL) is applied with a voltage between 0 V to 6 V according to the maximum Vt of the cells to be erased. The drain is floating.

Figure 9:
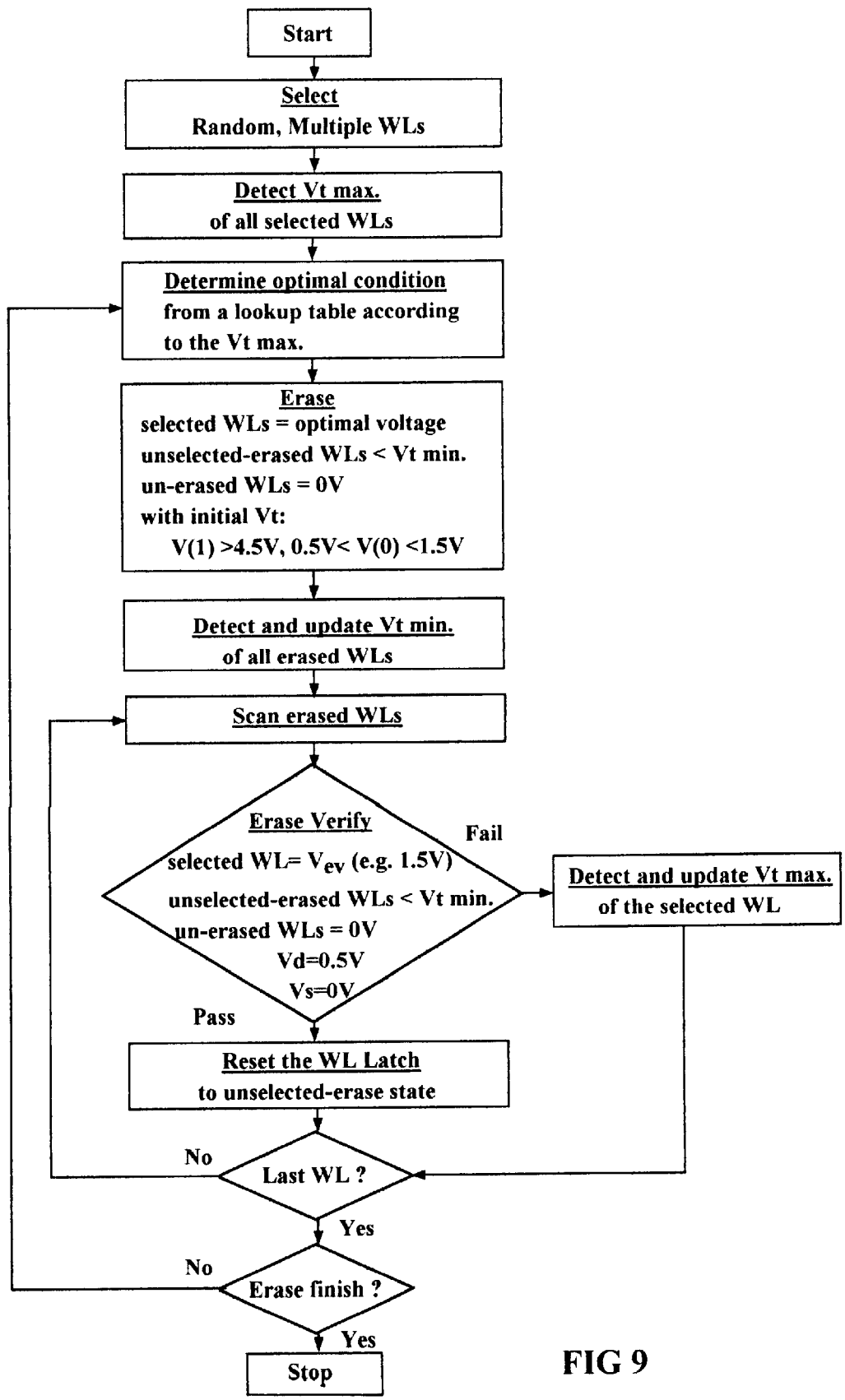
FIG. 9 shows the flowchart of the erase operation with an adjustable bias condition in the present invention.

With reference to FIG. 9, the flowchart of the erase operation for the preferred embodiment with adjustable bias condition in the invention shows steps to select numbers of WLs for erasing, to detect the maximum Vt of the cells to be erased, to adjust the erase condition to an optimal condition determined from a lookup table, to detect the minimum Vt of the erased cells and apply a voltage lower than the minimum Vt for shutting off over-erased cells, to scan erased WLs, to verify the erase state, to reset WL that passes verification to a unselected-erased state, to detect maximum Vt of cells on the selected WL that fails verification, and to continue next cycle of erase operation until the whole erase operation is completed.

The minimum Vt is detected by discharging the erased WLs from the negative high voltage for erasing to a value at which one or more than one cell is just turned on. This value of voltage is the minimum Vt. Another approach is to decrease the voltage on the WL from a high value, e.g. 5 V, to a value at which all the cells are just shut off. The former approach is preferred for the power consumption is lower than the latter one. If the minimum Vt is a negative value, a voltage lower than the minimum Vt is applied to all the erased WLs to shut off over-erased cells for verifying the erase result. If the WL voltage increases up to 0 V and none of the cells is turned on, 0 V is applied to all the cells since there is no over-erased cells.

The erase-verification is performed for all the erased cells WL by WL. In the invention, the erased WLs are allowed to be randomly distributed. Therefore, a novel scanning process is provided to internally search for these WLs for verification without increasing address registers to store the addresses of randomly selected WLs or reloading the addresses. With reference to the U.S. Pat. No. 5,822,252, the row-decoder of each WL has a WL latch for storing the state of the selection for erasing. When scanning, an address counter generates the addresses from the first WL to the last WL to find those WL latches that store a state indicating erasure. To increase the scanning speed, a number of WLs can be grouped into a block and each block has a block latch for storing the state of the selection for erasing. If one or more WLs in a block is selected for erasing, the block latch stores the state indicating erasure. Therefore, the scanning starts with the block latches and, only when an erasure state of a block is found, the WL latches in the block are scanned.

Figure 10:
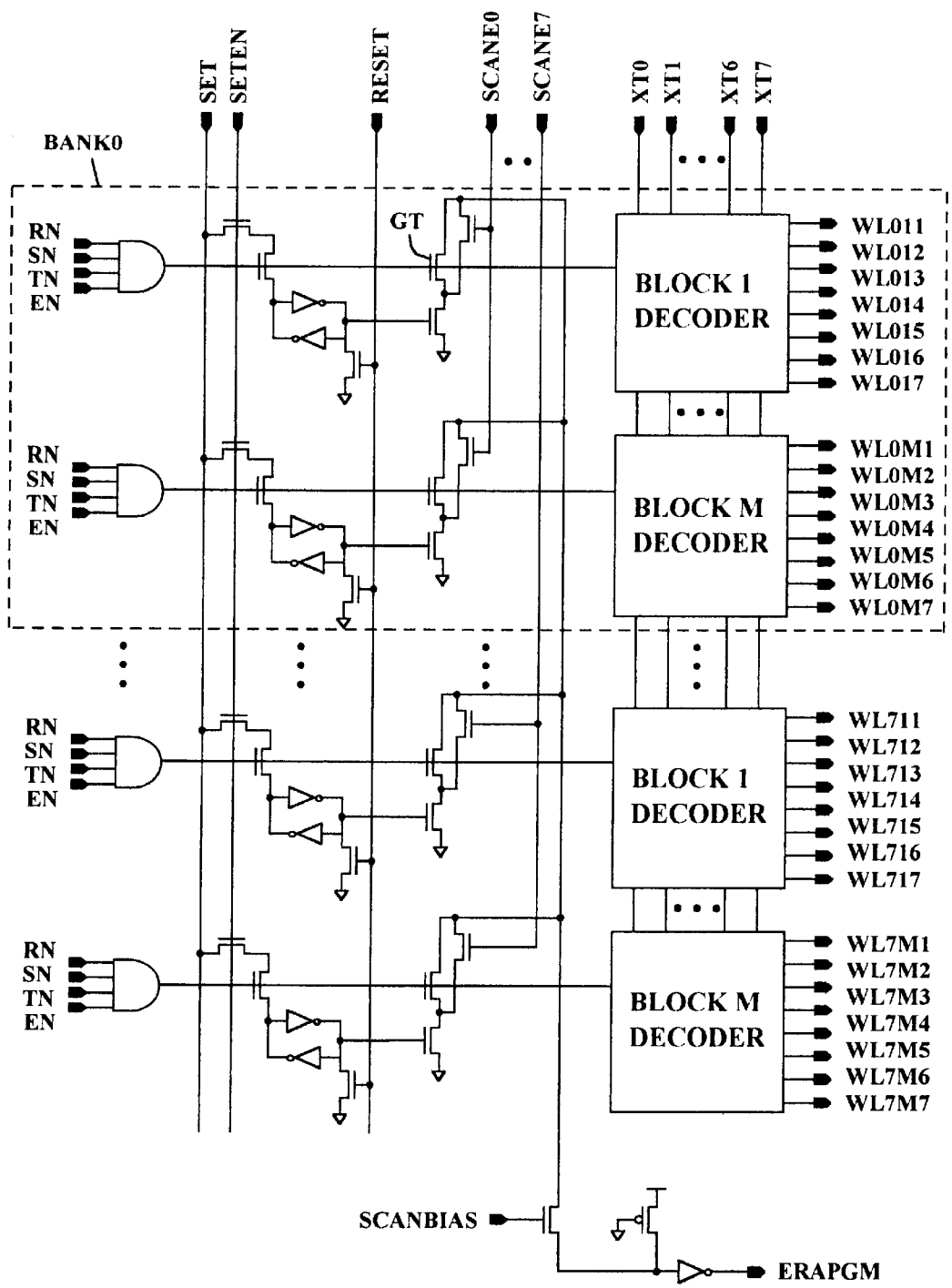
FIG. 10 shows a serial type scanning circuit of this invention.
Figure 11:
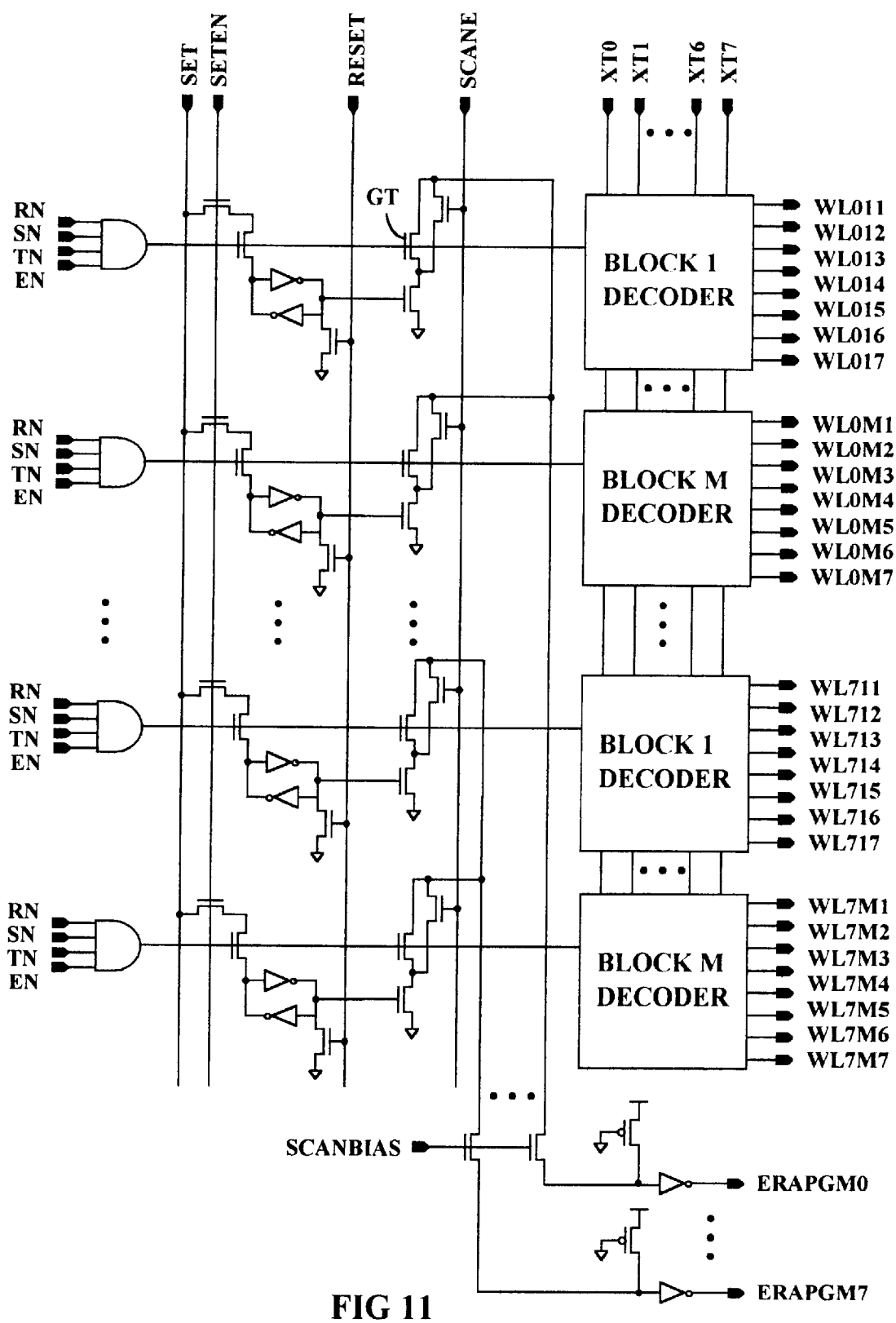
FIG. 11 shows a parallel type scanning circuit of this invention.

With reference to FIG. 10 and FIG. 11, a serial type scanning circuit and a parallel type scanning circuit are shown respectively. Refer to FIG. 10 for a detailed explanation of the serial type scanning circuit comprising eight memory banks. Each memory bank is divided into M blocks with eight WLs in each block. As shown in FIG. 10, a sense amplifier for sending the output signal ERAPGM is shared by the eight memory banks. All block latches are initially preset to low by a high RESET signal. When the address of an erased WL is transmitted, SETEN is high and the block latch of the block is set to high by a high SET signal.

In scanning, SCANE0 to SCANE7 transmit high pulses sequentially and SCANBIAS is high. If SCANE0 is high and any block latch in Bank0 is high, the sense amplifier transmits a high ERAPGM to signal that Bank0 has a state indicating erasure. The addresses of Block1 to BlockM in Bank0 are then transmitted sequentially to determine which block has a high block latch. The block predecoder of the selected block opens its corresponding pass gate GT. If the block latch is high, the sense amplifier transmits a high ERAPGM to signal that the block has a state indicating erasure. The signals XT0 to XT7 of the block are then transmitted sequentially to scan the latches of the 8 WLs in the block. The selected WL is, therefore, detected.

Referring to FIG. 11 for a detailed explanation of the parallel type scanning circuit comprising eight memory banks. Each memory bank has a sense amplifier of its own for sending its output signal. ERAPGM0 to ERAPGM7 as shown in FIG. 11 are the output signals of the eight sense amplifiers for the scanning circuit. In scanning, SCANE is high and the sense amplifier of each bank checks whether one or more than one block latch in the bank is high. If one or more than one block latch is high, the corresponding sense amplifier of the memory bank will transmit a high signal to show that the bank has a state indicating erasure. After the selected memory bank is identified, the scanning for determining which blocks and WLs have states indicating erasure is the same as what has been described for the serial type scanning circuit of FIG. 10.

When the scanning circuits of FIGS. 10 and 11 are not scanning, SCANBIAS is low in both serial and parallel types to cut off the standby current of the scanning circuit.

After an erased WL is found, it is applied with the erase-verify voltage Vev to verify the Vts of all the cells on the WL. If all the cells are turned on, the erase-verification has passed. The WL latch is reset to a state indicating unselected-erased, and the WL is applied with a voltage smaller than the minimum Vt to shut off all the cells as shown in FIG. 9. If the erase-verification fails, the maximum Vt of the WL is detected and stored to serve as the later reference for adjusting the bias condition in the next erase cycle. The maximum Vt is detected by increasing the voltage on the selected WL from the verify voltage to a voltage value at which all the cells on the WL are turned on. The voltage value is the maximum Vt of the WL.

The next erased WL is scanned. If the WL fails the verification too, its corresponding maximum Vt is found by above same operation except that the selected WL voltage is increased from the stored maximum Vt of the last erased WL. This operation is repeated for all the erased WLs and the maximum Vt of all the erased cells in the current erase-verify cycle is finally updated and stored.

At the beginning of each erase-verify cycle, the maximum Vt is reset to 0 V. At the end of the erase-verify cycle, if the last updated maximum Vt of all the erased cells in the erase-verify cycle is not updated to a value higher than the verify voltage value, the erase operation is accomplished. Otherwise, the next erase cycle is performed. It should be noted that the stored maximum Vt is updated until all the selected WLs have been erase-verified. The last updated maximum Vt obtained from the current verification cycle is used to determine the optimal bias condition of the next erase cycle if the erase operation has not been completed.

Figure 12:
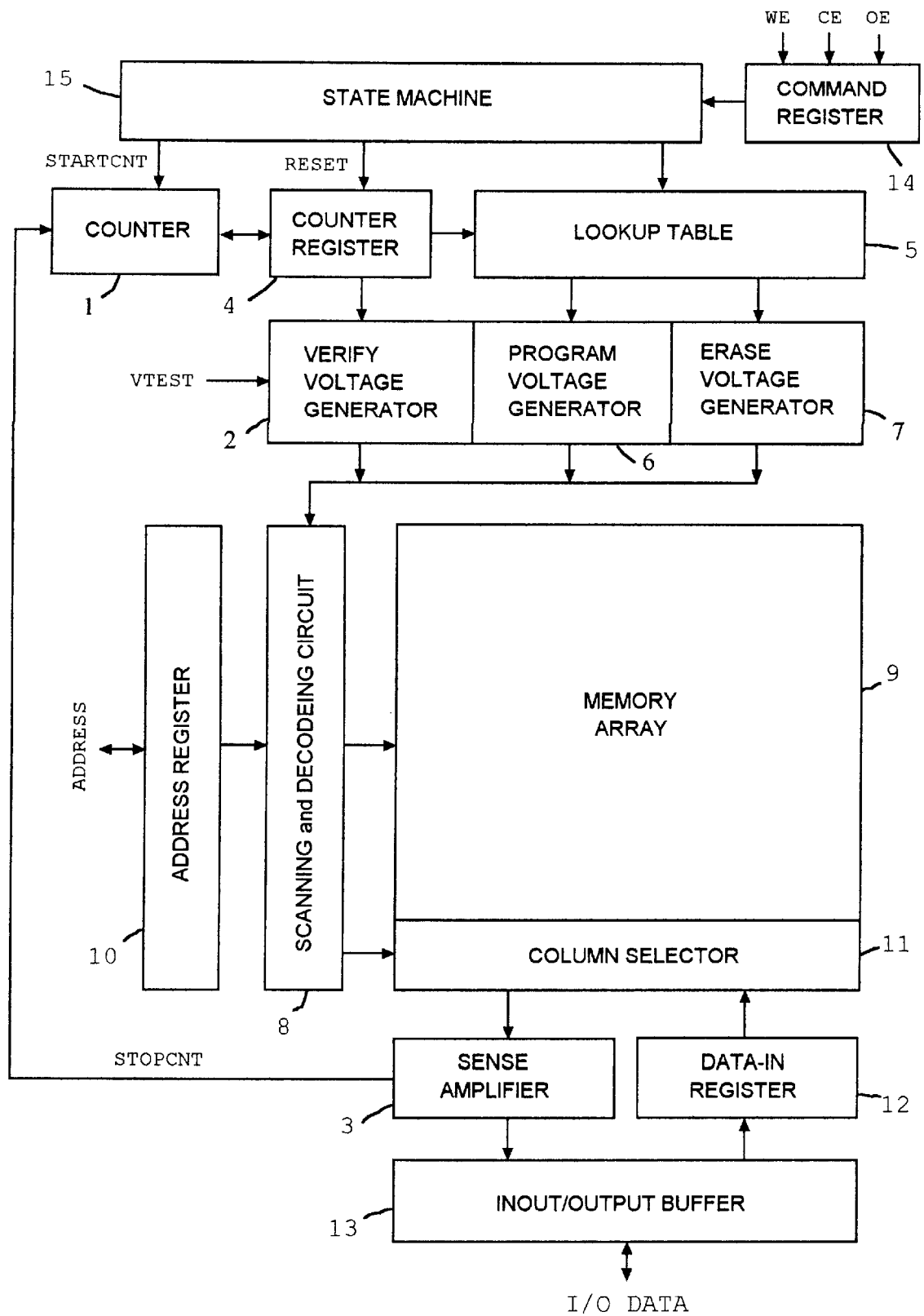
FIG. 12 shows the block diagram of a preferred embodiment for implementing the present invention.

FIG. 12 shows a block diagram for implementing a preferred embodiment of this invention. The embodiment comprises a memory array 9 having an array of memory cells. A scanning and decoding circuit 8 scans and selects the memory cells of the memory array 9. The scanning and decoding circuit 8 comprises a row decoder, column decoder and a scanning circuit that sends the desired cell address to the memory array 9. An address register 10 provides address to the scanning and decoding circuit 8.

The detection of the maximum Vt of memory cells on a selected WL during an erase-verify cycle is as follows. A counter 1 starts increment and drive a verify voltage generator 2 to increase the selected WL voltage stepwise from Vev to a value at which all the cells on the WL are turned on. Once all the cells have been turned on, a sense amplifier 3 will send a signal STOPCNT to stop the counter 1 and store its value in a counter register 4 attached to the counter. The voltage corresponding to this value is the maximum Vt of the WL. If the maximum Vt is to be updated, the counter 1 starts from the last value of maximum Vt stored in the counter register 4. This operation is repeated for all the erased WLs and the counter register 4 is updated to store the maximum Vt of all the erased cells in the current erase-verify cycle.

As shown in the block diagram of FIG. 12, the bias voltages for the adjustable bias condition of the invention are generated by a program voltage generator 6 and an erase voltage generator 7. Both voltage generators are controlled by the lookup table 5 for generating the desired program voltage and erase voltage. In this invention, the adjustable bias condition as discussed before is determined by the lookup table 5 according to updated threshold voltage Vt stored in the counter register 4.

A column selector 11 connected to the memory array 9 for sending the memory output to the sense amplifier 3 and accepting the input data stored in a data-in register 12. The sense amplifier 3 and the data-in register 12 are further connected to an input/output buffer 13. A command register 14 stores user commands and controls a state machine 15 that resets the counter register 4, starts the counter 1 and controls the lookup table 5 for the operation of the circuit system in the preferred embodiment. As shown in FIG. 12, the verify voltage generator 2 also has an input VTEST for sending test voltage to the WL of selected cells in a test mode.

Figure 13:
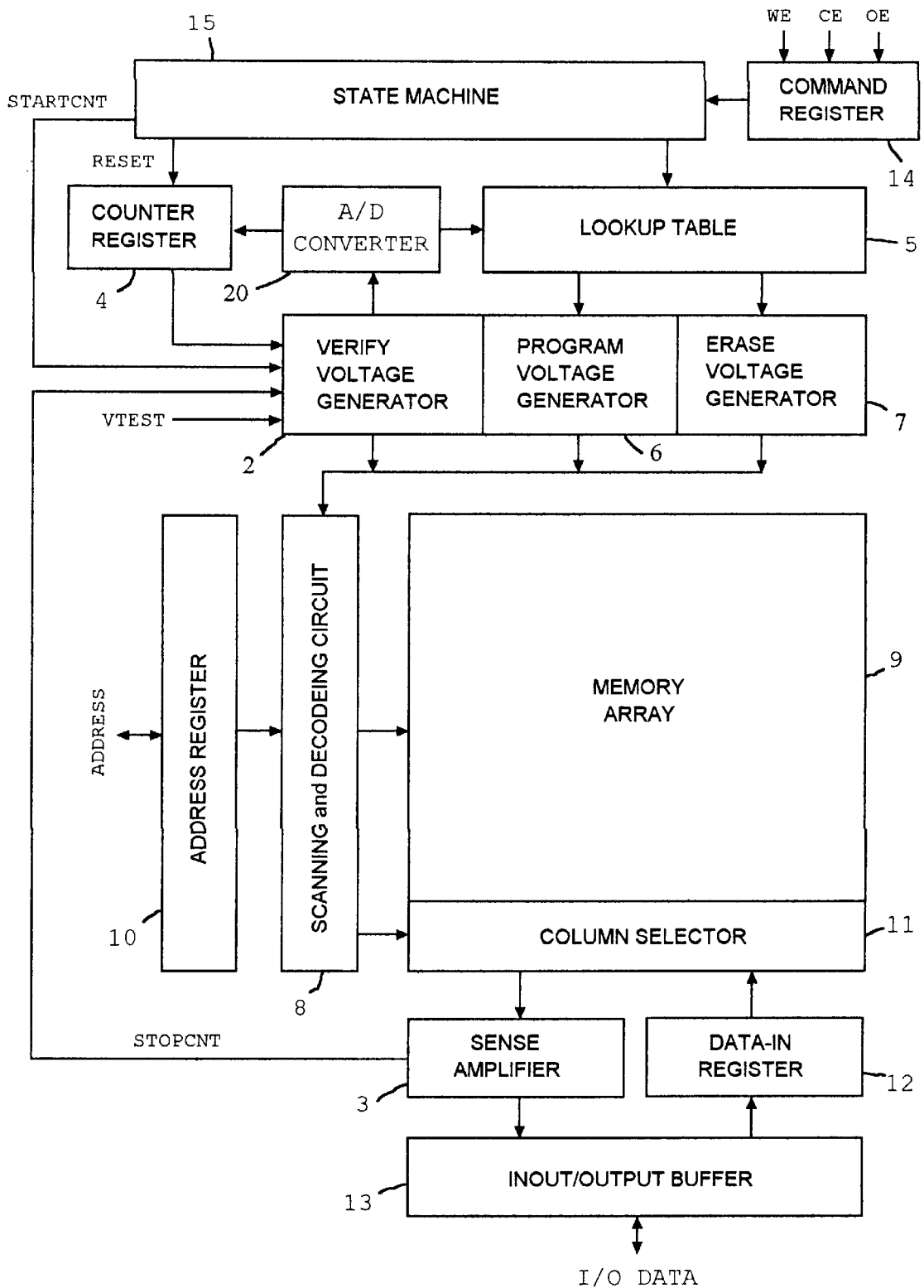
FIG. 13 shows the block diagram of another preferred embodiment for implementing the present invention.

FIG. 13 shows a block diagram of another preferred embodiment for implementing the invention. Except that an A/D converter 20 with an input from the verify voltage generator 2 replaces the counter 1 in FIG. 12 and the verify voltage is gradually increased, the other operations are almost identical to those described for FIG. 12. The counter register 4 is connected to the verify voltage generator 2 as well as the A/D converter 20. The STOPCNT signal is directed to the verify voltage generator 2 in FIG. 13. The circuit function accomplished by the embodiment of FIG. 12 can also be accomplished by that of FIG. 13. Note that the above examples can also detect the maximum Vt by using a decreasing WL voltage.

In order to reduce cell stress, the bias condition of this invention can be adjusted by varying the control gate voltage Vc and the source voltage Vs alternatively. Because the source usually suffers huge substrate current during an erase operation, it is preferred that the source voltage be kept at a less positive value and the voltage of the word line be gradually changed from a less negative value to a more negative value. After an iterative erase operation, the word line voltage can be fixed at the most negative value and the source voltage can be gradually changed from a less positive value to a more positive value for further erase operation if necessary.

Figure 14A:
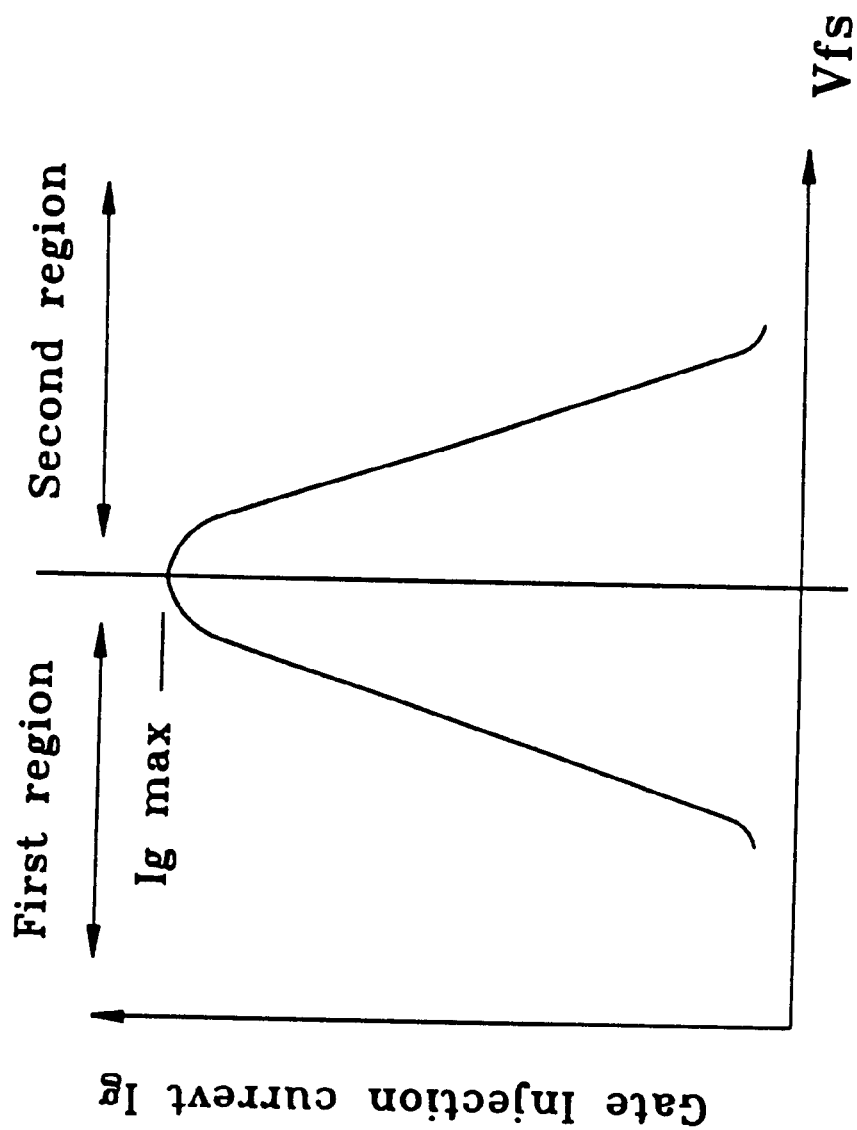
FIG. 14A shows the relationship between the gate injection current and the floating gate voltage.

Similar to the erase operation, the program performance, more specifically, the gate injection current, Ig, relates to the floating gate voltage Vfs, as shown in referenced paper (1995 IEDM, 11.3, pp. 271). With reference to FIG. 14A for a more detailed explanation, as Vfs increases, Ig increases in the first region to a maximum value, and then decreases in the second region. The cell channel is in a saturation mode in the first region, and in a linear mode in the second region. The maximum injection current occurs at the saturation mode in which the electrons are accelerated by the lateral electrical field induced by Vds (the voltage between the drain and the source), impacting the electron-hole pairs in the pinch-off region near the drain, and then the electrons are injected into the floating gate. The CHE is dominated as $$Vfs > Vds.$$

At the saturate mode, it is known that $$Vfs < Vds + Vt.$$

The floating gate voltage Vfs can also be described as $$Vfs = Ccf*Vc - Ccf*Vt + Cdf*Vds$$

where Cdf is the capacitive coupling ratio between the drain and the floating gate. Other parameters have been explained in previous paragraphs. From the above three expressions, the following relationships can be derived:

$$Vds < Ccf*Vc - Ccf*Vt + Cdf*Vds < Vds + Vt.$$

Figure 14B:
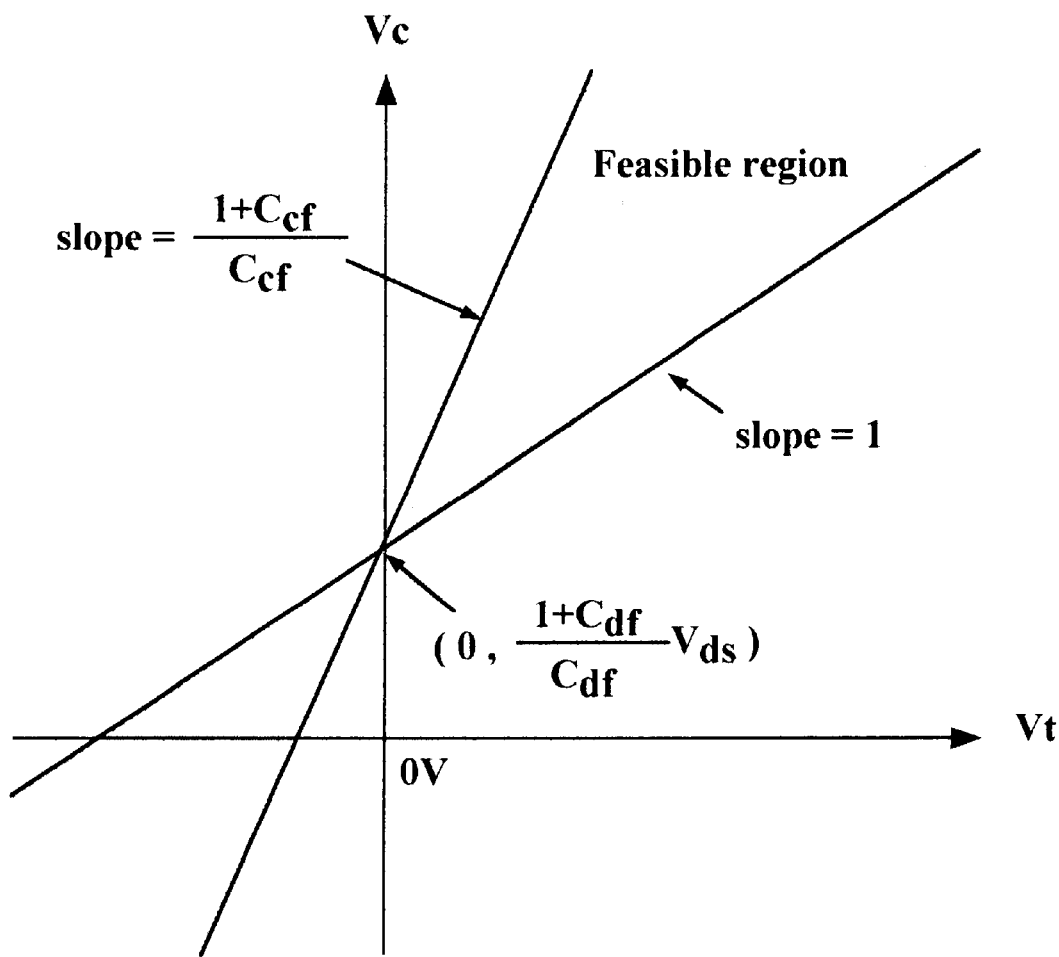
FIG. 14B shows a feasible region as a function of control gate voltage Vc and threshold voltage Vt for maximum gate injection current Ig.

Based on this inequality expression, the optimal bias conditions for Vc, Vds and hence, Vd and Vs, can be determined in accordance with Vt to obtain the highest programming efficiency. FIG. 14B shows a feasible region of maximum Ig that is determined by Vc, Vt and the other parameters as shown. For instance, if the drain voltage Vd is applied with 5 V, source voltage Vs is applied with 0 V, Ccf=50%, and Cdf=10%, the maximum Ig occurs at $$8 + Vt < Vc < 8 + 3*Vt.$$

For constant Vd (e.g. 5 V) and Vs (e.g. 0 V), Vc has to be increased with the same rate as Vt increases to sustain the optimal condition. Therefore, the injection current is always kept in the maximum for achieving the highest program efficiency. During the programming, Vc is increased in accordance with the increase of the Vt in order to sustain the optimal Vfs. Therefore, the highest program efficiency is achieved during the whole program operation.

Figure 15:
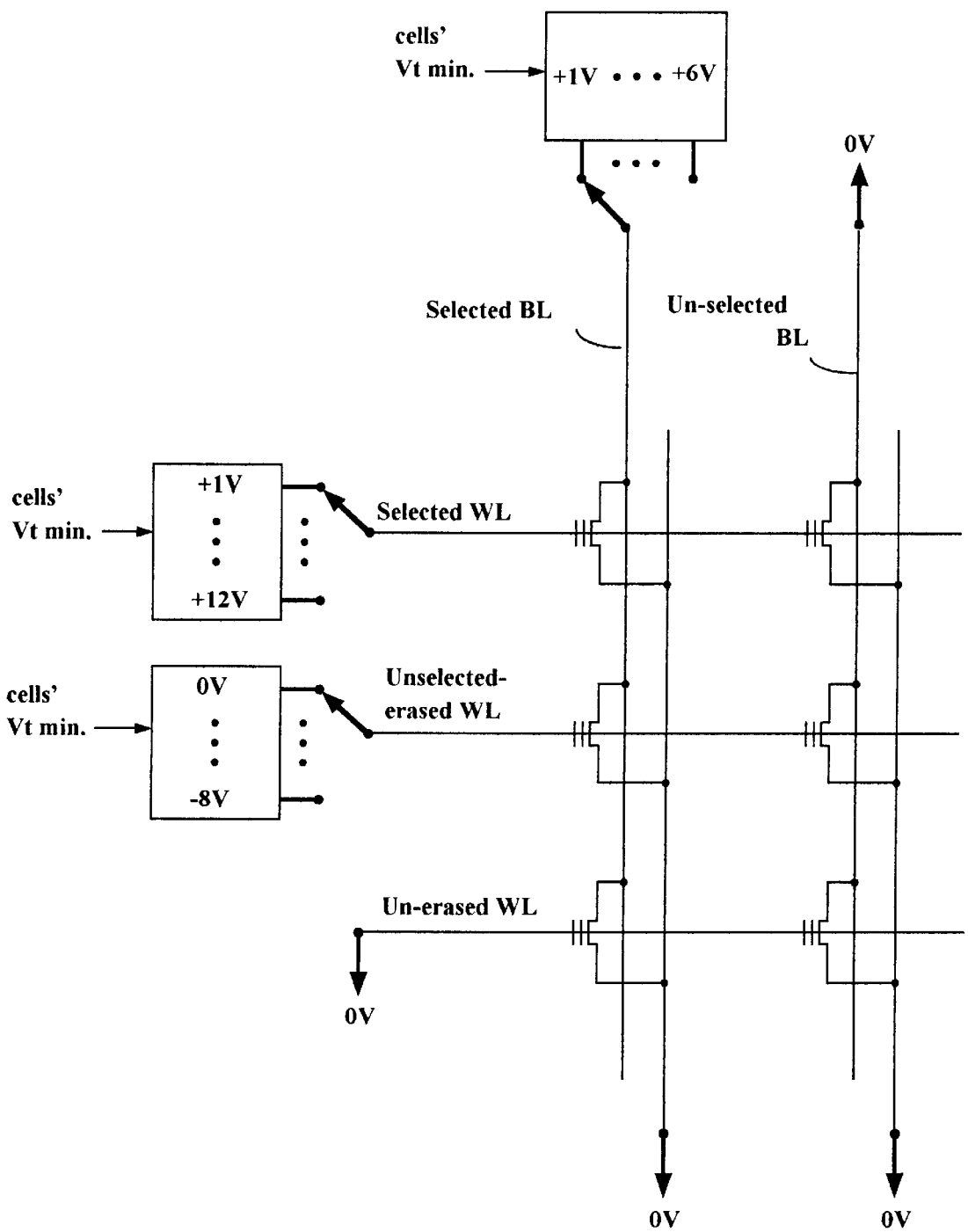
FIG. 15 shows an adjustable bias condition for the program operation in the present invention.

Similar to the erase operation, the adjustable bias conditions are provided by the lookup table. Although the above example only shows the bias condition Vc being adjusted in accordance with cell's Vt, the other bias conditions, such as Vd and Vs, can be also adjustable. FIG. 15 shows a circuit example for the adjustable bias condition of the program operation in the invention, where the unselected WL is applied with 0 V. The selected BL is applied with a voltage from 1 V to 6 V, in accordance with the minimum Vt of the selected cells. The source is applied with 0 V.

Figure 4:
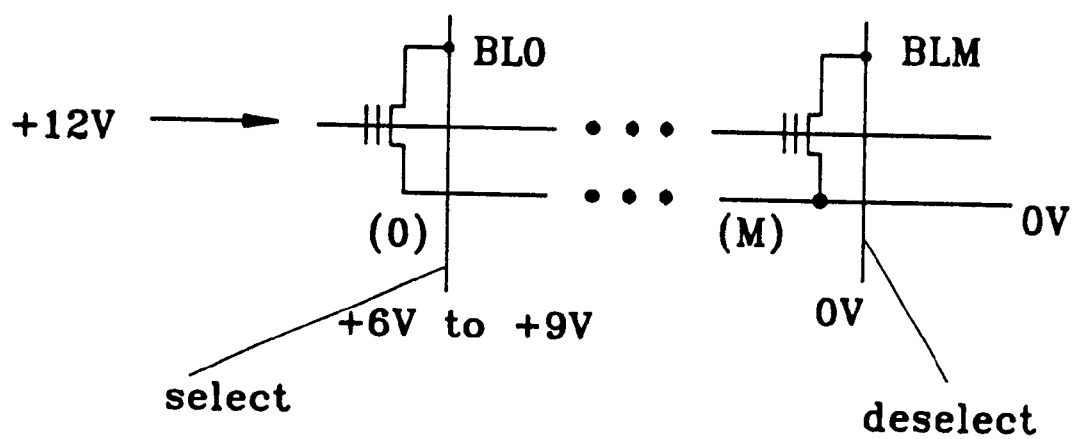
FIG. 4 shows a predetermined bias condition for the program operation in the prior arts.
Figure 16:
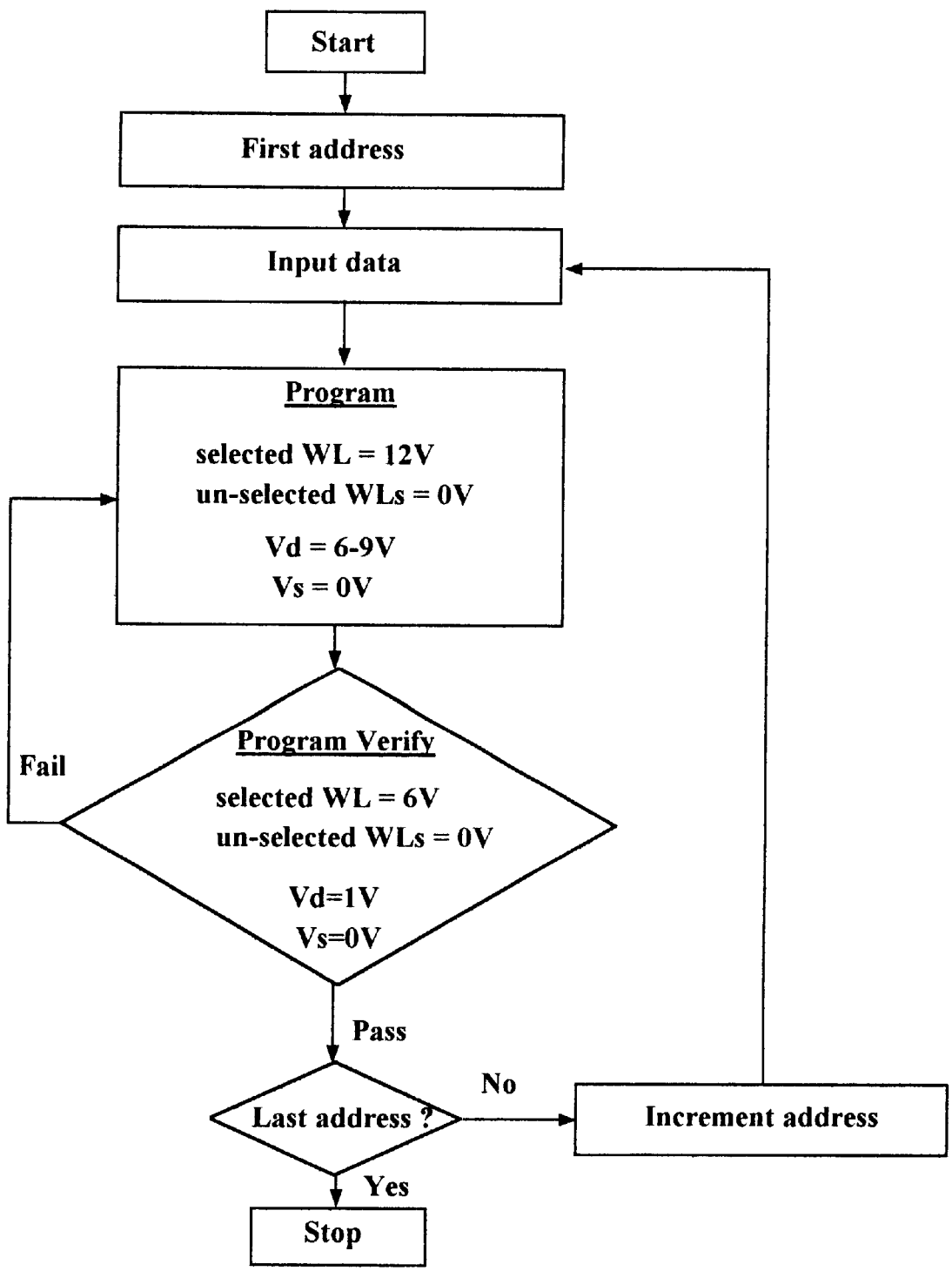
FIG. 16 shows the flowchart of the conventional program operation with a predetermined bias condition.
Figure 17:
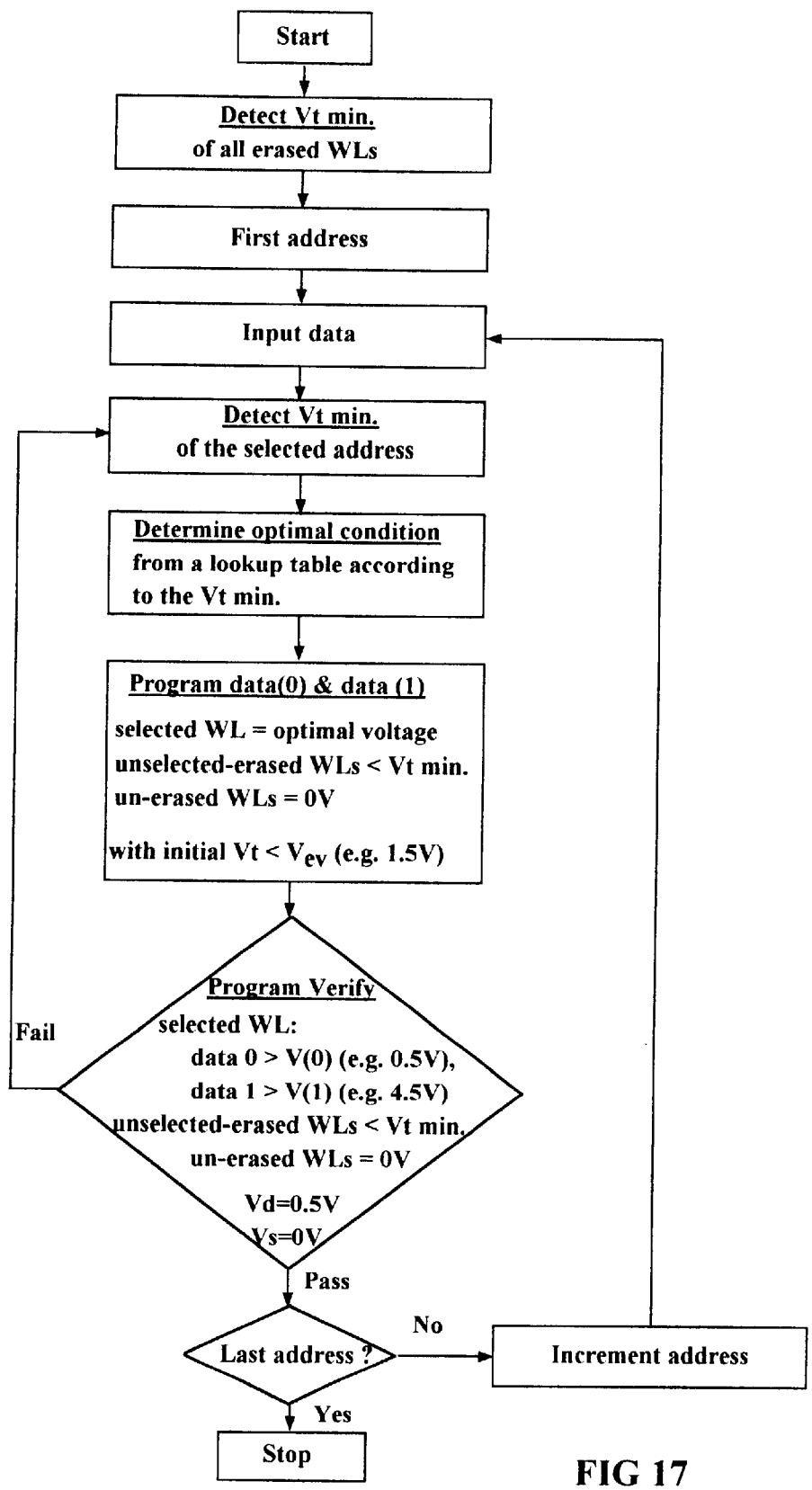
FIG. 17 shows the flowchart of the program operation of a preferred embodiment with adjustable bias condition of the present invention.

FIG. 16 shows the flowchart of a conventional program operation with the predetermined bias condition as shown in FIG. 4, where the bias condition is a predetermined constant during the whole programming process. With reference to FIG. 17, a flowchart of a preferred embodiment of the invention shows the program operation with adjustable bias condition. In the embodiment, the selected cells are programmed to data "0" (e.g. 0.5 V) and data "1" (e.g. 4.5 V) simultaneously, according to the input data. To shut off over-erased cells, a negative voltage lower than the minimum Vt of all the erased cells is applied to all the unselected WLs. The minimum Vt of the selected cells for programming is detected to adjust the bias condition before every program cycle. Therefore, the cell having lowest Vt will have highest program efficiency. The Vt distribution can be tightened. To further tighten the Vt distribution, each individual cell passing program-verify can be reset to unprogramming in the next program cycle (not shown in the flowchart).

Figure 18A:
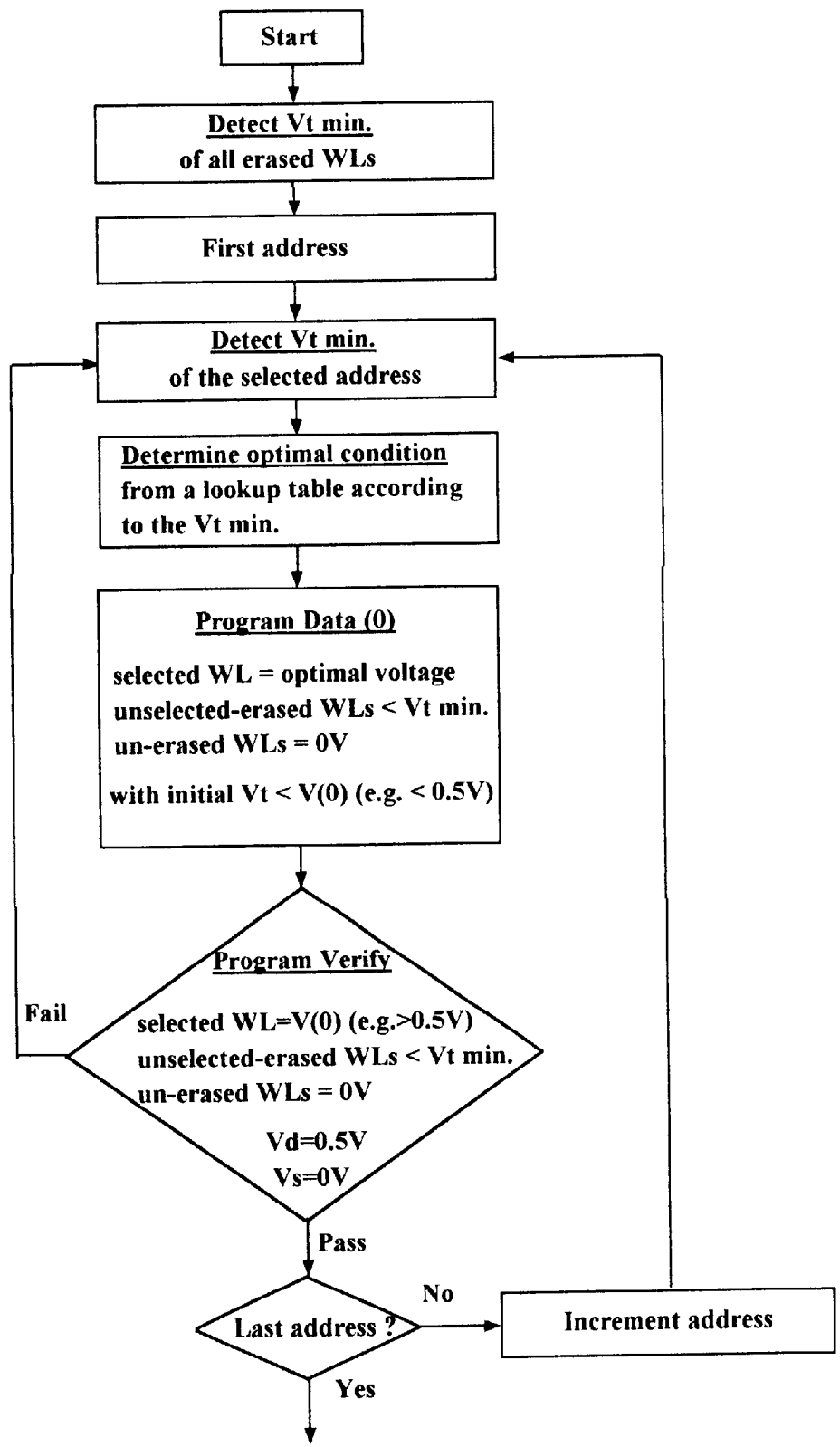
FIG. 18A and FIG. 18B show the flowchart of the program operation of another preferred embodiment with adjustable bias condition of the present invention.
Figure 18B:
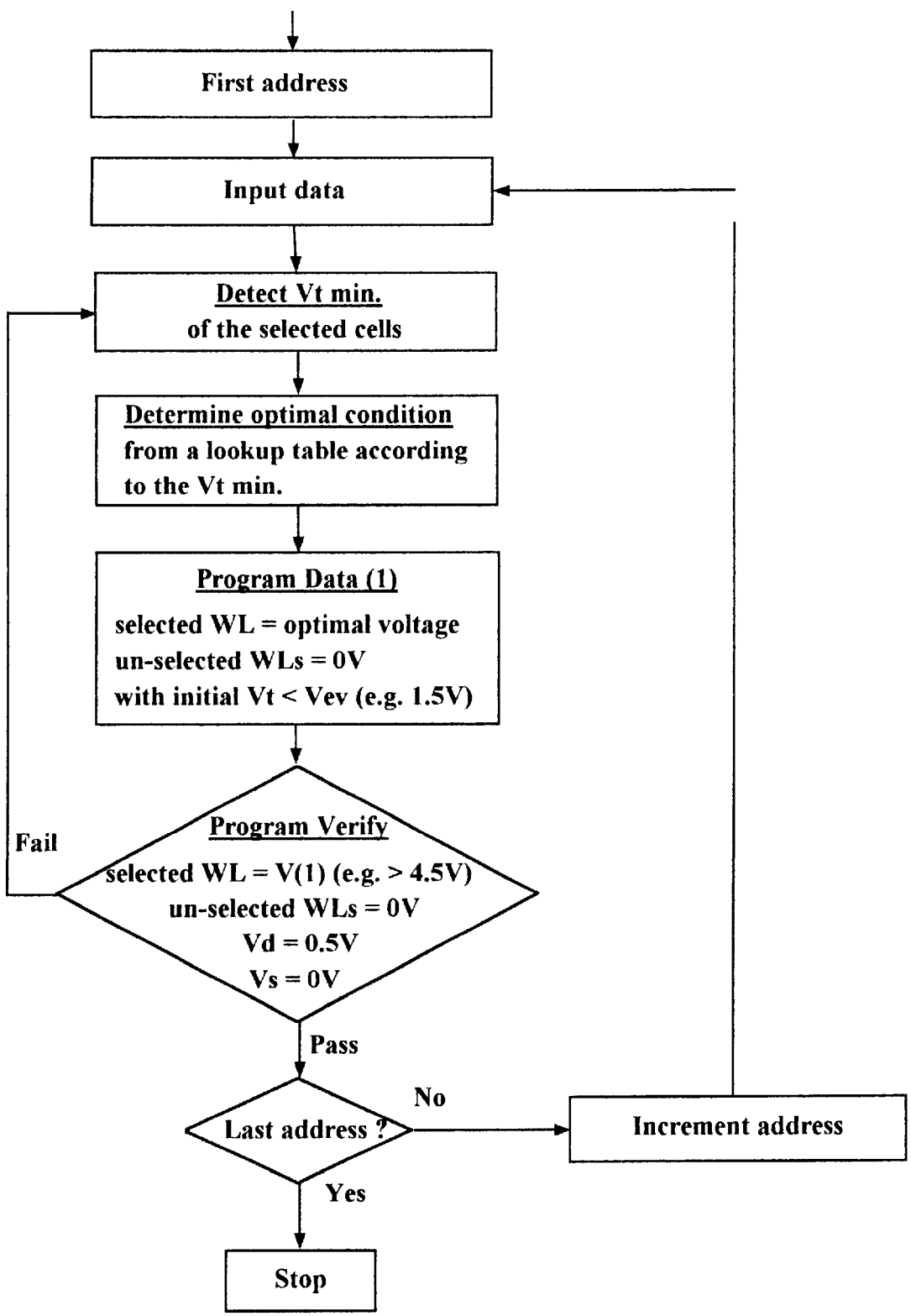

To advancedly minimize the cell stress, FIG. 18 shows a flowchart of the program operation of another embodiment in which all the erased cells are programmed to data "0" following the erase operation, and then all the unselected WLs are applied with 0 V and data "1" is programmed in the programming process according to the input data. The flowchart is divided into two parts shown by FIGS. 18A and 18B. The program operation shown in FIG. 18A is very similar to that shown in FIG. 17 with adjustable bias condition except that only data "0" is programmed and verified. After the programming of data "0", the operation as shown in FIG. 18B is executed for programming data "1". In both FIGS. 18A and 18B, the optimal bias condition in each program cycle is determined by a lookup table according to the minimum Vt of the cells selected for programming.

Figure 19A:
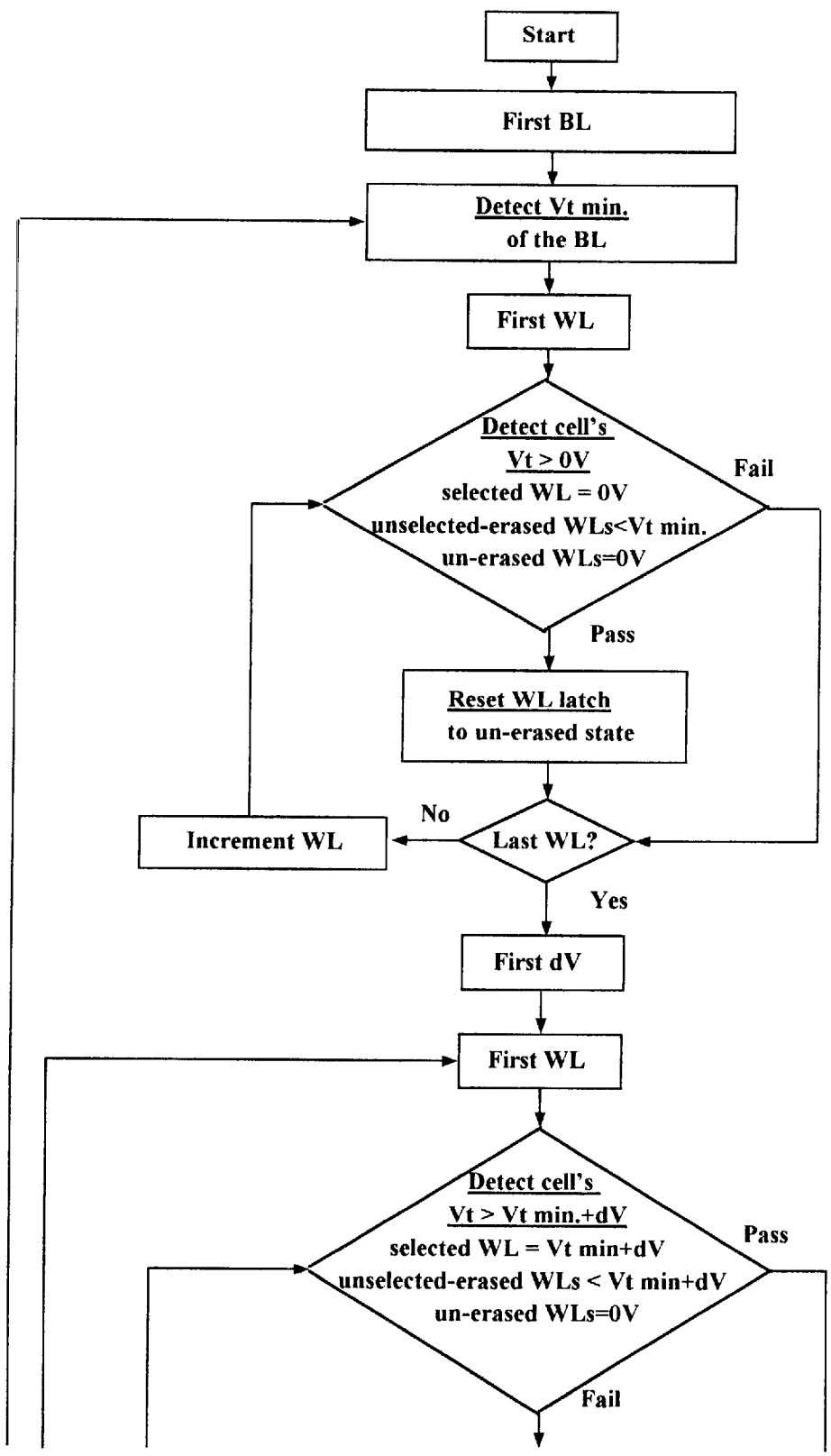
FIGS. 19A and 19B show the flowchart of programming abnormal erased cells of the present invention.
Figure 19B:
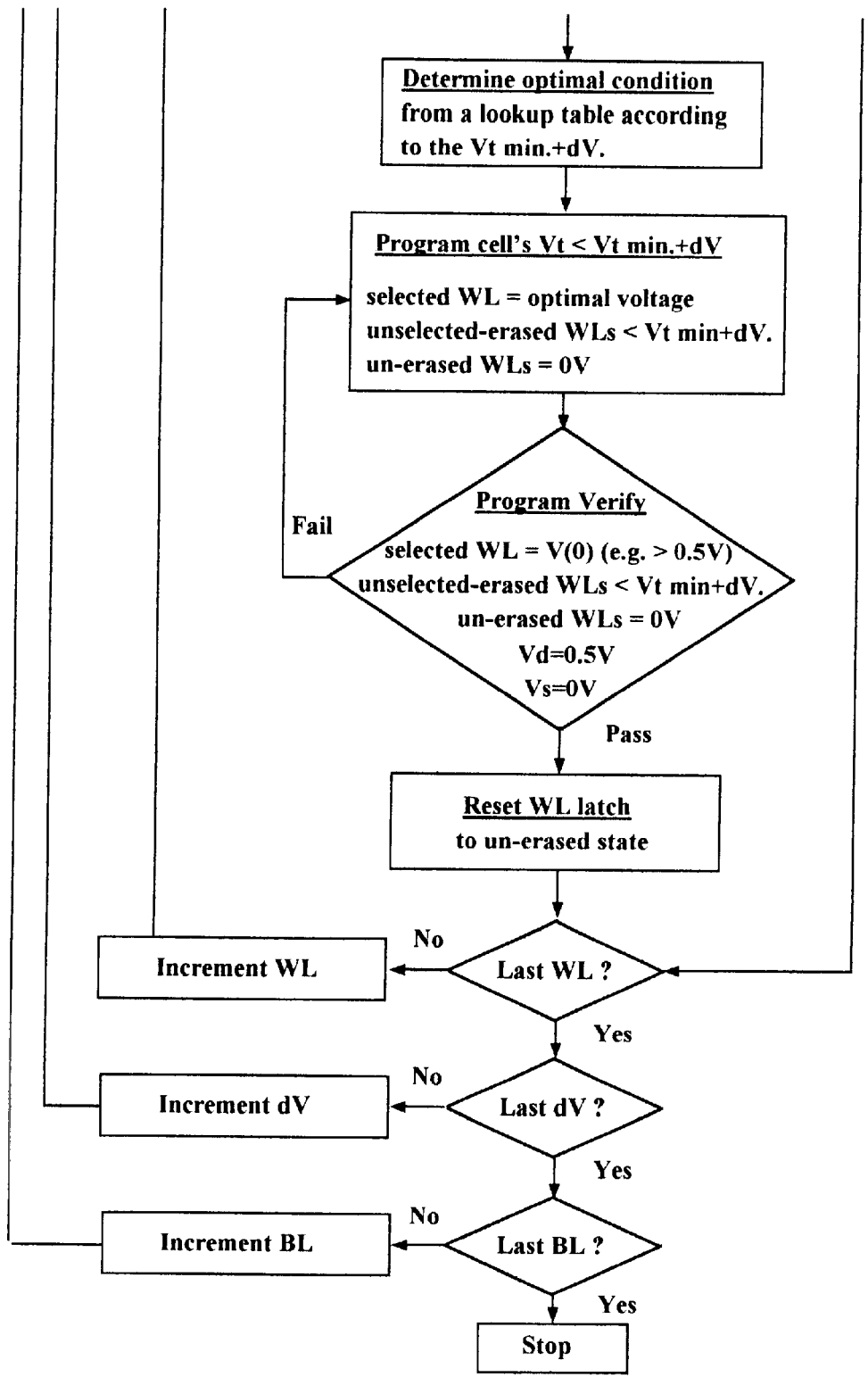

If some cells have abnormally fast erase speed, their Vts will become too negative during erasing. Conventionally, these cells will conduct large leakage current in verifying and be regarded as defective cells. To increase yield, the invention provides another embodiment for programming these cells to the desired Vt of data "0", before the normal programming as mentioned above is performed. FIG. 19 shows the flowchart of the embodiment of programming abnormally erased cells. An example in which cells having Vt lower than −3 V are regarded as abnormally erased cells is given in the following illustration. After erasing, if the minimum Vt of all the erased cells is lower than −3 V, for instance, −5 V, the locations of the abnormal cells are identified by applying all the WLs with −3 V to see which bit lines (BLs) still conduct current. The abnormal cells on those BLs are programmed BL by BL. For each selected BL, all the WLs are applied with a negative voltage lower than the minimum Vt of the BL to shut off all the over-erased cells on the BL, and then the cells with Vt higher than 0 V, including properly erased cells and unerased cells, are detected and their WLs are reapplied with 0 V to avoid breakdown due to strong vertical electric field in programming the over-erased cells. Then, another voltage is applied to sequentially program each over-erased cells to data "0".

To advancedly reduce the cell stress and increase the endurance, the cells with the lowest Vt are programmed first. The whole process is that those cells with Vt lower than −5 V are programmed to data "0", and then those cells with Vt lower than −4 V are programmed to data "0" step by step. Finally, all the cells with Vt lower than −3 V are successfully programmed and verified to data "0", and then a normal programming for selected cells according to input data can be performed. Each time when all the cells in a Vt level are successfully programmed, the negative voltage for shutting off over-erased cells can be increased by dV to the next level of voltage to reduce the stress of cells during programming. The embodiment can be used on all the over-erased cells with Vt lower than 0 V, rather than −3 V, to further minimize the cell stress.

Although the above examples show that the adjustable bias condition in accordance with cells' Vts can enhance the erase/program performance, the adjustable conditions are not confined in the examples. For instance, the width of an pulse and the number of pulses can be also adjusted in accordance with the cells' Vts.

Besides, the factor that can be detected for adjusting the bias condition is not limited by the cells' Vts. For example, it is known that the tunneling current of the erase operation, Ige, and the injection current of program operation, Igp, are both decreased for increasing temperatures as follows:

$$Ige = Igoe - fe(T-To)$$

$$Igp = Igop - fp(T-To)$$

where Igoe is the tunneling current of the erase operation at temperature To, Igop is the injection current of the program operation at temperature To, fe(T) is the temperature effect of the tunneling current of the erase operation, and fp(T) is the temperature effect of the injection current of the program operation.

For applications which require higher standard for stability of temperature such as military application, the bias condition adjustable by the temperature can be implemented by a normal temperature sensor, and then the temperature is converted to a digital signal to the chip.

An Aplus voltage controller, which is associated with the row decoder introduced in the U.S. Pat. No. 5,822,252 by Aplus Integrated Circuit, Inc., is used in this invention to save the power consumption of the iterative verifications. The voltage controller changes the WL voltage without charging and discharging the high voltage well during the frequent verifications, so the power consumption is greatly reduced. Please refer to the patent application for a detailed explanation.

The measurement of the cell's Vt is important because it provides device characteristics during operations, particularly for erasing and programming, as reference for design and processing. None of the prior arts can 100% accurately measure the cells Vt from an array during an erase operation because the leakage current of over-erased cells disturbs the read operation. Instead, the Vt data are obtained conventionally from a test chip. However, it is well known that the accuracy of the data is arguable because the resistance, capacitance, locations of the cells on the layout of the real array and the test chip are different and erase/program characteristics are very sensitive to these parameters. In the invention, every cell's Vt can be measured directly from the array because over-erasure issues are eliminated. With reference to FIG. 12 and FIG. 13 for the exemplary block diagrams of the invention, the Vt data of any address in the array can be measured by externally controlling the verify voltage generator 2 with a voltage VTEST to increase the selected WL voltage from the minimum Vt of all the cells to a value at which the data readout is "0". This voltage value is the Vt of the selected cell.

Since the test mode is generally prepared for test engineers, to prevent users from unexpected entrance of the test mode which may cause malfunctions, some protection mechanisms such as requiring a high voltage to be applied to a specific pin of the chip or a specific command to be issued to the chip can be designed in. The cell's Vt is measured in a test mode, which is triggered by applying a high Voltage to a specific pin or by issuing a command at any time, including the suspension of erase and program operations.

What is claimed is:

1. A flash memory, which provides adjustable bias conditions for erase and program operations, comprising:
   a memory array having an array of memory cells arranged in rows and columns for storing desired memory data, whereby each row of memory cells is connected by a word line and each column of memory cells is connected by bit lines;

a lookup table storing adjustable bias conditions including control gate voltage Vc, source voltage Vs, drain voltage Vd, pulse width and pulse number;

a counter register connected to to said lookup table to control settings of the adjustable bias conditions;

a counter connected to said counter register to receive a starting value from said counter register and to control contents said counter register;

a verify voltage generator connected to said counter register for generating verify voltages according to said control value;

a program voltage generator connected to said lookup table for generating program voltages necessary to place the desired memory data within said memory array, according to the adjustable bias conditions from said lookup table;

an erase voltage generator connected to said lookup table for generating erase voltages necessary to remove memory data from said memory array, according to the adjustable bias conditions from said lookup table;

an address register for receiving and storing the memory address of at least one of the memory cells in said memory array which is to have memory data programmed or erased;

a scanning and decoding circuit connected to the verify voltage generator, the program voltage generator, the erase voltage generator, and the address register to accept said verify voltages, said program voltages, said erase voltages, and the memory address for erasing and programming at least one of the memory cells, said scanning and decoding circuit including:

a scanning circuit for detecting which word line connected to one row of memory cells has been selected for erasing or programming;

a column decoder for determining from said memory address which desired column of memory cells has been selected for erasing or programming; and a row decoder for flexibly selecting at least one word line connected to one row of the memory cells to be erased or programmed and disabling the word lines of rows of nonselected memory cells, wherein said scanning and decoding circuit is controlled to detect maximum and minimum threshold voltages of the memory cells on a row of memory cells for determining an optimal bias condition prior to an erase or program operation;

a column selector connected to said scanning and decoder circuit and to said memory array for selecting the desired columns of said memory array;

a sense amplifier connected to said column selector for detecting the desired memory data read from said memory array, said sense amplifier having a control line connected to said counter for stopping said counter to determine said maximum threshold voltages of the memory cells on a row of memory cells;

a data-in register connected to said column selector for storing the desired memory data to be programmed in said memory array;

an input/output buffer connected to said sense amplifier and said data-in register for buffering the desired memory data to stored in and read from said memory array;

a state machine connected to said counter register, said counter, and said lookup table for controlling the erase and program operations of said memory array;

and a command register connected to the state machine for storing commands and controlling said state machine.

2. The flash memory as claimed in claim 1, wherein said scanning and decoding circuit applies a control gate voltage Vc and a source voltage Vs provided by said erase voltage generator according to said adjustable bias conditions stored in said lookup table for erasing memory cells, and said row decoder providing a first voltage to the word lines which are selected but already successfully erased, a second voltage to the word lines which are selected and still to be erased, and a third voltage to unselected word lines simultaneously for executing a sequential verify operation for the erased memory cells.

3. The flash memory as claimed in claim 2, wherein said sequential verify operation comprises the step of applying a verify voltage to a word line connected to a row of erased memory cells to validate if the threshold voltage of an erased memory cell on the row of erased memory cells has achieved an erased state voltage level.

4. The flash memory as claimed in claim 2, wherein said sequential verify operation comprises the step of applying an increasing voltage to a word line of erased memory cells to turn on all erased memory cells on the word line and terminate said verify operation, said increasing voltage being increased from a first negative voltage to a maximum threshold voltage at which all erased memory cells on the word line are turned on.

5. The flash memory as claimed in claim 2, wherein said sequential verify operation comprises the step of applying a decreasing voltage to a word line of erased memory cells to just turn off at least one erased memory cell on the row of memory cells and terminate said verify operation, said decreasing voltage being decreased from a high voltage to a maximum threshold voltage at which at least one erased memory cell on the row of memory cells is just turned off.

6. The flash memory as claimed in claim 2, wherein said adjustable bias conditions for said control gate voltage Vc and said source voltage Vs are determined by threshold voltages of memory cells selected for erasing to reduce hole trapping.

7. The flash memory as claimed in claim 6, wherein said adjustable bias conditions for said control gate voltage Vc and said source voltage Vs are determined by the maximum threshold voltage of said memory cells selected for erasing.

8. The flash memory as claimed in claim 1, wherein said scanning and decoding circuit programs memory cells selected for programming bit line by bit line with the adjustable bias conditions and executes a sequential verify operation by programming all the selected memory cells to a desired threshold voltage below the threshold voltage for data "0" and then programming the selected memory cells to their desired threshold voltages according to desired memory data stored in the data-in register.

9. The flash memory as claimed in claim 8, wherein said adjustable bias conditions depend on the minimum threshold voltage of said memory cells selected for programming.

10. The flash memory as claimed in claim 8, wherein said adjustable bias conditions for programming all the selected memory cells to a desired threshold voltage below the threshold voltage for data "0" is achieved by applying incrementally and repetitively a programming voltage from approximately −5 V to approximately 0 V to the word lines connected to the rows of selected memory cells whereby each programming voltage is incrementally modified by approximately 1 V.

11. The flash memory as claimed in claim 8, wherein said scanning and decoding circuit programs selected memory cells in groups dependent on the detected maximum and minimum threshold voltage of said selected memory cells.

12. The flash memory as claimed in claim 8, wherein said sequential verify operation further comprises the step of applying a voltage to a word line of a row of programmed memory cells to validate if the threshold voltage of the selected memory cells on the word line reaches a desired value for a program state.

13. The flash memory as claimed in claim 2, wherein a location of said memory cells to be selected to be erased is decoded from the memory address retained in the address register and said row decoder comprises a plurality of word line latches for storing a selection state for each row of said memory cells selected for erasing, whereby the selection state has a first condition wherein the row of memory cells is successfully erased and a second condition wherein the row of memory cells is still to be erased.

14. The flash memory as claimed in claim 13, wherein said row decoder further comprises a block latch for storing the state of selection for a block of the plurality of word line latches and indicating that the block of the plurality of word line latches is selected if at least one word line connected to the block of the plurality of word line latches is selected.

15. The flash memory as claimed in claim 1, wherein said row decoder erases memory cells selected for erasing by applying the control gate voltage Vc and the source voltage Vs provided by said erase voltage generator according to said adjustable bias conditions stored in said lookup table, said control gate voltage Vc ranging from a most negative value to a least negative value and said source voltage Vs ranging from a least positive value to a most positive value, said control gate voltage Vc being gradually adjusted from its least negative value to its most negative value by setting source voltage Vs at its least positive value for executing an iterative erase operation initially and said source voltage Vs being gradually adjusted from its least positive value to its most positive value by setting control gate voltage Vc at its most negative value for executing further erase operation.

16. The flash memory as claimed in claim 1, wherein said scanning circuit comprises a serial type scanning means for scanning a plurality of memory banks sequentially, each of said memory banks comprising a plurality of memory blocks and each memory block comprising a plurality of rows of memory cells.

17. The flash memory as claimed in claim 1, wherein said scanning circuit comprises a parallel type scanning for scanning a plurality of memory banks in parallel, each of said memory banks comprising a plurality of memory blocks and each memory block comprising a plurality of rows of memory cells.

18. The flash memory as claimed in claim 1, wherein said verify voltage generator further comprises a test input providing a test mode in which the threshold voltage of a memory cell is measured by applying an externally controlled voltage to the word line connected to the row of the memory cell being measured.

19. An erase/program method for fully eliminating over-erasure of a non-volatile memory including a plurality of memory cells arranged in an array of rows and columns for retaining memory data, whereby each row of memory cells is connected by a word line and each column of memory cells is connected by bit lines, whereby a plurality of rows form a memory block and a plurality of memory blocks form a memory bank, and wherein said erase/program method is comprising the steps of:

selecting at least one word line connected to a row of memory cells to be erased;

detecting a maximum threshold voltage level and a minimum threshold voltage level of the selected memory cells connected to the selected word line:

executing an erase operation for erasing memory cells of at least one row of memory cells connected to the word lines selected for erasing to a low state with an adjustable bias condition to maintain low vertical and horizontal electric fields in the memory cells for decreasing hole trapping and stabilizing threshold voltages of said memory cells, said memory cells having lower threshold voltages in a low state, said bias condition being optimally determined by the maximum and minimum threshold voltages of the memory cells connected to the row of memory cells which are connected to said selected word lines;

performing an erase-verify operation for erase-verifying memory cells erased in said erase operation by applying an erase-verify voltage to the word lines connected to the rows of memory cells being erase-verified and applying a disable voltage to word lines connected to rows of memory cells being erased-verified;

selecting at least one word line connected to a row of memory cells to be programmed;

executing a program operation for programming selected memory cells to a high state with an adjustable bias condition to achieve a maximum gate injection current for speeding up program operation, said selected memory cells having higher threshold voltages in a high state; and performing a program-verify operation for program-verifying selected memory cells programmed in said program operation by applying a program-verify voltage to the word lines connected to rows of selected memory cells being program-verified and applying a disable voltage to word lines connected to rows of memory cells being program-verified.

20. The erase/program method as claimed in claim 19, wherein said disable voltage in said erase-verify operation is lower than a minimum threshold voltage determined by the detecting of the minimum threshold voltage of said memory cells of the rows of memory cells connected to the selected word lines after said erase operation with a serial scanning means, said serial scanning means having word line latches attached to each word line indicating an erasure state of the row of memory cells connected to each word line, block latches connected to each memory block indicating the erasure state of said memory block whereby said serial scanning means scans the block latches and the word line latches of each memory bank to identify erase memory cells.

21. The erase/program method as claimed in claim 19, wherein said program operation further comprises the step of programming over-erased cells having threshold voltages lower than approximately 0 V bit line by bit line, said programming has the steps of:

detecting the threshold voltages of the selected memory cells;

ordering a location of the selected memory cells according to their threshold voltages; and reiteratively programming the selected cells starting with those selected memory cells having a lowest threshold.

22. The erase/program method as claimed in claim 19, wherein said program operation further comprises the step of programming selected memory cells with data "0" and data "1" according to the contents of a data-in register.

23. The erase/program method as claimed in claim 19, wherein said erase operation comprises the step of deeply erasing all selected memory cells to an over-erased state, and said program operation of comprises the step of programming all selected memory cells to data "0".

24. The erase/program method as claimed in claim 19, wherein said adjustable bias conditions for erase and program operations respectively are retained in a lookup table and chosen according to the detected maximum and minimum threshold voltages.

25. The erase/program method as claimed in claim 19, wherein said disable voltage in said erase-verify operation is lower than a minimum threshold voltage determined by the detecting of the minimum threshold voltage of said memory cells of the rows of memory cells connected to the selected word lines after said erase operation with a parallel scanning means, said parallel scanning means having word line latches attached to each word line indicating an erasure state of the row of memory cells connected to each word line, block latches connected to each memory block indicating the erasure state of said memory block whereby said parallel scanning means scans the block latches and the word line latches of each memory bank to identify erase memory cells.

26. The flash memory as claimed in claim 19, wherein said scanning and decoding circuit applies a control gate voltage Vc and a source voltage Vs provided by said erase voltage generator according to said adjustable bias conditions stored in said lookup table for erasing memory cells, and said row decoder providing a first voltage to the word lines which are selected but already successfully erased, a second voltage to the word lines which are selected and still to be erased and a third voltage to unselected word lines simultaneously for executing a sequential verify operation for the erased memory cells.

27. The flash memory as claimed in claim 26, wherein said sequential verify operation comprises the step of applying a verify voltage to a word line connected to a row of erased memory cells to validate if the threshold voltage of an erased memory cell on the row of erased memory cells has achieved an erased state voltage level.

28. The flash memory as claimed in claim 26, wherein said sequential verify operation comprises the step of applying an increasing voltage to a word line of erased memory cells to turn on all erased memory cells on the word line and terminate said verify operation, said increasing voltage being increased from a first negative voltage to a maximum threshold voltage at which all erased memory cells on the word line are turned on.

29. The flash memory as claimed in claim 26, wherein said sequential verify operation comprises the step of applying a decreasing voltage to a word line of erased memory cells to just turn off at least one erased memory cell on the row of memory cells and terminate said verify operation, said decreasing voltage being decreased from a high voltage to a maximum threshold voltage at which at least one erased memory cell on the row of memory cells is just turned off.

30. The flash memory as claimed in claim 26, wherein said adjustable bias conditions for said control gate voltage Vc and said source voltage Vs are determined by threshold voltages of memory cells selected for erasing to reduce hole trapping.

31. The flash memory as claimed in claim 30, wherein said adjustable bias conditions for said control gate voltage Vc and said source voltage Vs are determined by the maximum threshold voltage of said memory cells selected for erasing.

32. The flash memory as claimed in claim 26, wherein a location of said memory cells to be selected to be erased is decoded from the memory address retained in the address register and said row decoder comprises a plurality of word line latches for storing a selection state for each row of said memory cells selected for erasing, whereby the selection state has a first condition wherein the row of memory cells is successfully erased and a second condition wherein the row of memory cells is still to be erased.

33. The flash memory as claimed in claim 32, wherein said row decoder further comprises a block latch for storing the state of selection for a block of the plurality of word line latches and indicating that the block of the plurality of word line latches is selected if at least one word line connected to the block of the plurality of word line latches is selected.

34. A flash memory, which provides adjustable bias conditions for erase and program operations, comprising:
 a memory array having an array of memory cells arranged in rows and columns for storing desired memory data, whereby each row of memory cells is connected by a word line and each column of memory cells is connected by bit lines;
 a lookup table storing adjustable bias conditions including control gate voltage Vc, source voltage Vs, drain voltage Vd, pulse width and pulse number;
 a counter register connected to said lookup table to control settings of the adjustable bias conditions;
 a verify voltage generator connected to said counter register for generating verify voltages according to said control value;
 an analog to digital converter connected to the verify voltage generator, the counter register, and the lookup table, for converting verify voltages to digital values and sending said digital values to said counter register and said lookup table;
 a program voltage generator connected to said lookup table for generating program voltages necessary to place the desired memory data within said memory array, according to the adjustable bias conditions from said lookup table;
 an erase voltage generator connected to said lookup table for generating erase voltages necessary to remove memory data from said memory array, according to the adjustable bias conditions from said lookup table;
 an address register for receiving and storing the memory address of at least one of the memory cells in said memory array which is to have memory data programmed or erased;
 a scanning and decoding circuit connected to the verify voltage generator, the program voltage generator, the erase voltage generator, and the address register to accept said verify voltages, said program voltages, said erase voltages, and the memory address for erasing and programming at least one of the memory cells, said scanning and decoding circuit including:
  a scanning circuit for detecting which word line connected to one row of memory cells has been selected for erasing or programming;
  a column decoder for determining from said memory address which desired column of memory cells has been selected for erasing or programming; and
  a row decoder for flexibly selecting at least one word line connected to one row of the memory cells to be erased or programmed and disabling the word lines of rows of nonselected memory cells,
  wherein said scanning and decoding circuit is controlled to detect maximum and minimum threshold voltages of the memory cells on a row of memory cells for determining an optimal bias condition prior to an erase or program operation;

a column selector connected to said scanning and decoder circuit and to said memory array for selecting the desired columns of said memory array;

a sense amplifier connected to said column selector for detecting the desired memory data read from said memory array, said sense amplifier having a control line connected to said counter for stopping said counter to determine said maximum threshold voltages of the memory cells on a row of memory cells;

a data-in register connected to said column selector for storing the desired memory data to be programmed in said memory array;

an input/output buffer connected to said sense amplifier and said data-in register for buffering the desired memory data to stored in and read from said memory array;

a state machine connected to said counter register, said counter and said lookup table for controlling the erase and program operations of said memory array;

and a command register connected to the state machine for storing commands and controlling said state machine.

35. The flash memory as claimed in claim 34, wherein said scanning and decoding circuit programs memory cells selected for programming bit line by bit line with the adjustable bias conditions and executes a sequential verify operation by programming all the selected memory cells to a desired threshold voltage below the threshold voltage for data "0" and then programming the selected memory cells to their desired threshold voltages according to desired memory data stored in the data-in register.

36. The flash memory as claimed in claim 35, wherein said adjustable bias conditions depend on the minimum threshold voltage of said memory cells selected for programming.

37. The flash memory as claimed in claim 35, wherein said adjustable bias conditions for programming all the selected memory cells to a desired threshold voltage below the threshold voltage for data "0" is achieved by applying incrementally and repetitively a programming voltage from approximately −5 V to approximately 0 V to the word lines connected to the rows of selected memory cells whereby each programming voltage is incrementally modified by approximately 1 V.

38. The flash memory as claimed in claim 35, wherein said scanning and decoding circuit programs selected memory cells in groups dependent on the detected maximum and minimum threshold voltage of said selected memory cells.

39. The flash memory as claimed in claim 35, wherein said sequential verify operation further comprises the step of applying a voltage to a word line of a row of programmed memory cells to validate if the threshold voltage of the selected memory cells on the word line reaches a desired value for a program state.

40. The flash memory as claimed in claim 34, wherein said row decoder erases memory cells selected for erasing by applying the control gate voltage Vc and the source voltage Vs provided by said erase voltage generator according to said adjustable bias conditions stored in said lookup table, said control gate voltage Vc ranging from a most negative value to a least negative value and said source voltage Vs ranging from a least positive value to a most positive value, said control gate voltage Vc being gradually adjusted from its least negative value to its most negative value by setting source voltage Vs at its least positive value for executing an iterative erase operation initially and said source voltage Vs being gradually adjusted from its least positive value to its most positive value by setting control gate voltage Vc at its most negative value for executing further erase operation.

41. The flash memory as claimed in claim 34, wherein said scanning circuit comprises a serial type scanning means for scanning a plurality of memory banks sequentially, each of said memory banks comprising a plurality of memory blocks and each memory block comprising a plurality of rows of memory cells.

42. The flash memory as claimed in claim 34, wherein said scanning circuit comprises a parallel type scanning means for scanning a plurality of memory banks in parallel, each of said memory banks comprising a plurality of memory blocks and each memory block comprising a plurality of rows of memory cells.

43. The flash memory as claimed in claim 34, wherein said verify voltage generator further comprises a test input providing a test mode in which the threshold voltage of a memory cell is measured by applying an externally controlled voltage to the word line connected to the row of the memory cell being measured.

* * * * *